United States Patent
Bae et al.

(10) Patent No.: US 12,426,248 B2
(45) Date of Patent: Sep. 23, 2025

(54) SEMICONDUCTOR DEVICES

(71) Applicant: Samsung Electronics Co., Ltd., Suwon-si (KR)

(72) Inventors: Sohyeon Bae, Seoul (KR); Wonchul Lee, Seongnam-si (KR); Jaehyun Kim, Cheonan-si (KR); Jaehyuk Jang, Hwaseong-si (KR); Hyebin Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/420,138

(22) Filed: Jan. 23, 2024

(65) Prior Publication Data

US 2024/0172417 A1 May 23, 2024

Related U.S. Application Data

(63) Continuation of application No. 17/484,679, filed on Sep. 24, 2021, now Pat. No. 11,917,812.

(30) Foreign Application Priority Data

Feb. 22, 2021 (KR) .................. 10-2021-0023131

(51) Int. Cl.
*H10B 12/00* (2023.01)
*H01L 23/528* (2006.01)

(52) U.S. Cl.
CPC ......... *H10B 12/315* (2023.02); *H01L 23/528* (2013.01)

(58) Field of Classification Search
CPC .. H10B 12/315; H10B 12/0335; H10B 12/30; H01L 23/528; H01L 23/5226; H01L 23/5386; H10D 64/512
See application file for complete search history.

(56) References Cited

U.S. PATENT DOCUMENTS 9,508,723 B2    11/2016  Lee et al.
9,543,211 B1     1/2017  Lu et al.
(Continued)

FOREIGN PATENT DOCUMENTS

CN    111640757 A     9/2020
KR    10-0349681 B1   2/2002
(Continued)

OTHER PUBLICATIONS

Taiwanese Office Action and Search Report dated Nov. 21, 2022 issued in Taiwanese Patent Application No. 110138170.

*Primary Examiner* — Galina G Yushina
(74) *Attorney, Agent, or Firm* — Harness, Dickey, & Pierce, P.L.C.

(57) ABSTRACT

A method of manufacturing a semiconductor device including partially etching an upper portion of a substrate to form a recess extending in a first direction parallel to an upper surface of the substrate, forming a gate structure in the recess, the gate structure including a first conductive pattern, a second conductive pattern on the first conductive pattern, and a gate mask on the second conductive pattern, partially etching an end portion of the gate structure in the first direction to form an opening, the opening extending through end portions of the gate mask and the second conductive pattern of the gate structure to expose a portion of the first conductive pattern, and a bottom of the opening being lower than a lower surface of the exposed portion of the first conductive pattern, and forming a contact plug in the opening.

20 Claims, 33 Drawing Sheets

(56) References Cited

U.S. PATENT DOCUMENTS

| | | |
|---|---|---|
| 9,576,959 B1 | 2/2017 | Dong et al. |
| 9,935,168 B2 | 4/2018 | Horak et al. |
| 9,941,206 B2 | 4/2018 | Kang |
| 10,096,546 B2 | 10/2018 | Yoon et al. |
| 10,600,791 B2 | 3/2020 | Kim et al. |
| 10,600,896 B2 | 3/2020 | Matsuo et al. |
| 10,600,955 B2 | 3/2020 | Sonoda |
| 10,964,711 B2 | 3/2021 | Murata et al. |
| 11,183,510 B2 | 11/2021 | Mihara |
| 11,227,991 B2 | 1/2022 | Seong et al. |
| 2007/0178634 A1 | 8/2007 | Jung et al. |
| 2015/0123238 A1* | 5/2015 | Jang ............... H10B 12/00 257/503 |
| 2015/0255464 A1* | 9/2015 | Lee ............... H10D 64/017 438/237 |
| 2015/0333059 A1* | 11/2015 | Lee ............... H10B 12/053 257/334 |
| 2017/0025420 A1 | 1/2017 | Park et al. |
| 2018/0240705 A1 | 8/2018 | Chang et al. |
| 2019/0206877 A1* | 7/2019 | Kim ............... H10B 63/30 |
| 2019/0378851 A1 | 12/2019 | Takizawa et al. |
| 2020/0083229 A1* | 3/2020 | Kim ............... H10D 88/00 |
| 2020/0091303 A1 | 3/2020 | Nam |
| 2020/0402981 A1* | 12/2020 | Kim ............... H10B 12/0335 |
| 2020/0402982 A1 | 12/2020 | Park et al. |
| 2021/0091001 A1 | 3/2021 | Suzuki et al. |

FOREIGN PATENT DOCUMENTS

| | | |
|---|---|---|
| TW | 201712863 A | 4/2017 |
| TW | 201801364 A | 1/2018 |
| TW | 201841345 A | 11/2018 |
| TW | 201939776 A | 10/2019 |
| TW | I695487 B | 6/2020 |
| TW | I721316 B | 3/2021 |

* cited by examiner

SEMICONDUCTOR DEVICES

CROSS-REFERENCE TO RELATED APPLICATION

This application is a divisional of U.S. patent application Ser. No. 17/484,679 filed on Sep. 24, 2021, which claims priority under 35 U.S.C. § 119 to Korean Patent Application No. 10-2021-0023131 filed on Feb. 22, 2021 in the Korean Intellectual Property Office, the disclosure of each of which is hereby incorporated by reference in its entirety.

BACKGROUND

Some example embodiments relate to a semiconductor device. More particularly, some example embodiments relate to a semiconductor device including a gate structure and a contact plug contacting the gate structure.

In a DRAM device, a gate structure buried in an upper portion of a substrate and serving as a word line (or a row) may include a first conductive pattern containing a metal and a second conductive pattern containing polysilicon doped with impurities such as phosphorus and/or arsenic. A contact plug for transferring electrical signals to the gate structure may be formed by forming an opening through the second conductive pattern by an etching process to expose the first conductive pattern and filling a conductive material in the opening. If the second conductive pattern has a large thickness, the etching process might not be easily performed.

SUMMARY

Some example embodiments provide a semiconductor device having improved characteristics.

According to some example embodiments of inventive concepts, there is provided a semiconductor device. The semiconductor device may include a gate structure in a substrate, the gate structure extending in a first direction parallel to an upper surface of the substrate and including a first conductive pattern, a second conductive pattern on the first conductive pattern, and a gate mask on the second conductive pattern. The semiconductor device includes a contact plug contacting an end portion in the first direction of the gate structure, the contact plug including, a first extension portion extending in a vertical direction perpendicular to the upper surface of the substrate and contacting sidewalls of the gate mask and the second conductive pattern, a second extension portion under the first extension portion and contacting the first extension portion and a sidewall of the first conductive pattern, and a protrusion portion under the second extension portion and contacting the second extension portion, a bottom of the protrusion portion not contacting the first conductive pattern. A first angle of a sidewall of the first extension portion with respect to the upper surface of the substrate is greater than a second angle of a sidewall of the second extension portion with respect to the upper surface of the substrate.

According to some example embodiments of inventive concepts, there is a provided semiconductor device. The semiconductor device may include a gate structure in a substrate, the gate structure extending in a first direction parallel to an upper surface of the substrate and including a first conductive pattern, a barrier pattern at least partially covering a sidewall and a lower surface of the first conductive pattern, a second conductive pattern on the first conductive pattern and the barrier pattern, and a gate mask on the second conductive pattern. The semiconductor device includes a contact plug contacting an end portion in the first direction of the gate structure, the contact plug including, a first extension portion extending in a vertical direction perpendicular to the upper surface of the substrate and contacting sidewalls of the gate mask and of the second conductive pattern, a second extension portion under the first extension portion and contacting the first extension portion, the second extension portion contacting a sidewall of the first conductive pattern and an upper surface of the barrier pattern, and a protrusion portion under the second extension portion and contacting the second extension portion, the protrusion portion contacting an outer sidewall of the barrier pattern.

According to some example embodiments of inventive concepts, there is provided a semiconductor device. The semiconductor device may include an active pattern on a substrate, a gate structure recessed in an upper portion of the substrate and on the active pattern, the gate structure extending in a first direction parallel to an upper surface of the substrate and including a first conductive pattern, a second conductive pattern on the first conductive pattern, and a gate mask on the second conductive pattern. The semiconductor device includes a bit line structure contacting a middle portion of the active pattern and extending in a second direction parallel to the upper surface of the substrate and perpendicular to the first direction, a first contact plug structure contacting each of opposing end portions of the active pattern, a capacitor on the first contact plug structure. And a second contact plug contacting an end portion in the first direction of the gate structure, the second contact plug including, a first extension portion extending in a vertical direction perpendicular to the upper surface of the substrate and contacting sidewalls of the gate mask and of the second conductive pattern, a second extension portion under the first extension portion and contacting the first extension portion, the second extension portion contacting a sidewall of the first conductive pattern, and a protrusion portion under the second extension portion and contacting the second extension portion, a bottom of the protrusion portion not contacting the first conductive pattern. A first angle of a sidewall of the first extension portion with respect to the upper surface of the substrate is greater than a second angle of a sidewall of the second extension portion with respect to the upper surface of the substrate.

In the semiconductor device, the area of the contact plug contacting the gate structure may increase, and thus the contact resistance may decrease.

DETAILED DESCRIPTION

The above and other aspects and features of a method of cutting a fine pattern, a method of forming active patterns using the same, and/or a method of fabricating a semiconductor device using the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

FIGS. 1 to 33 are plan views and cross-sectional views illustrating a method of fabricating a semiconductor device according to some example embodiments. Specifically, FIGS. 1, 4, 7, 9, 13, 20, 24 and 28 are the plan views, FIGS. 2, 5, 7, 10, 12, 14, 16, 18, 21, 25, 26, 29 and 31-32 are cross-sectional views taken along lines A-A' of corresponding plan views, respectively, and each of FIGS. 3, 6, 8, 11, 15, 17, 19, 22-23, 27, 30 and 33 includes cross-sections taken along lines B-B' and C-C' of a corresponding plan view.

Hereinafter, in the specifications (but not necessarily in the claims), two directions substantially parallel to an upper surface of a substrate 100 and substantially perpendicular to each other may be referred to as first and second directions D1 and D2, respectively, and a direction substantially parallel to the upper surface of the substrate 100 and having an acute angle with respect to the first and second directions D1 and D2 may be referred to as a third direction D3.

Figure 1:
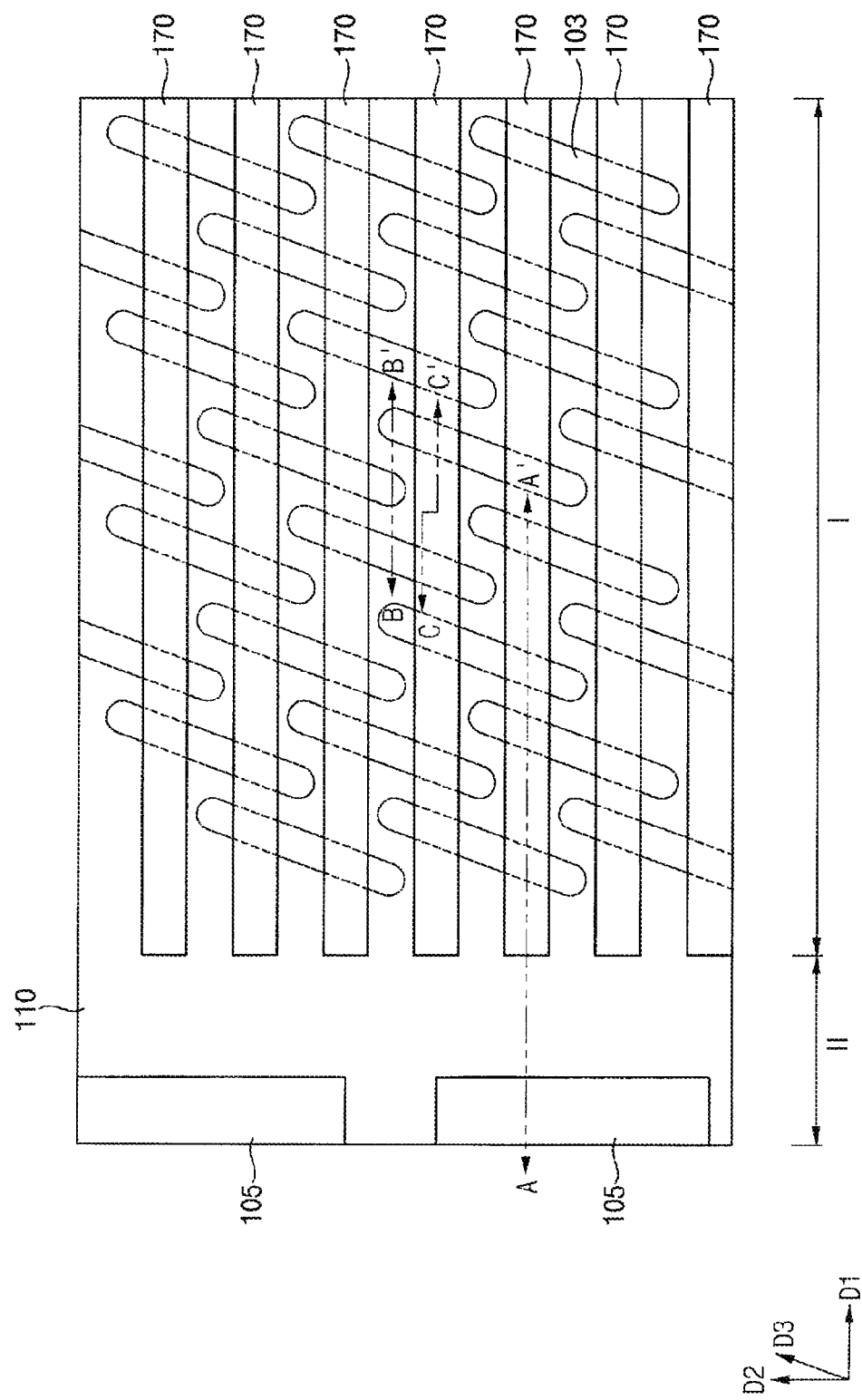
FIGS. 1 to 33 are plan views and cross-sectional views illustrating a method of manufacturing a semiconductor device according to some example embodiments.
Figure 2:
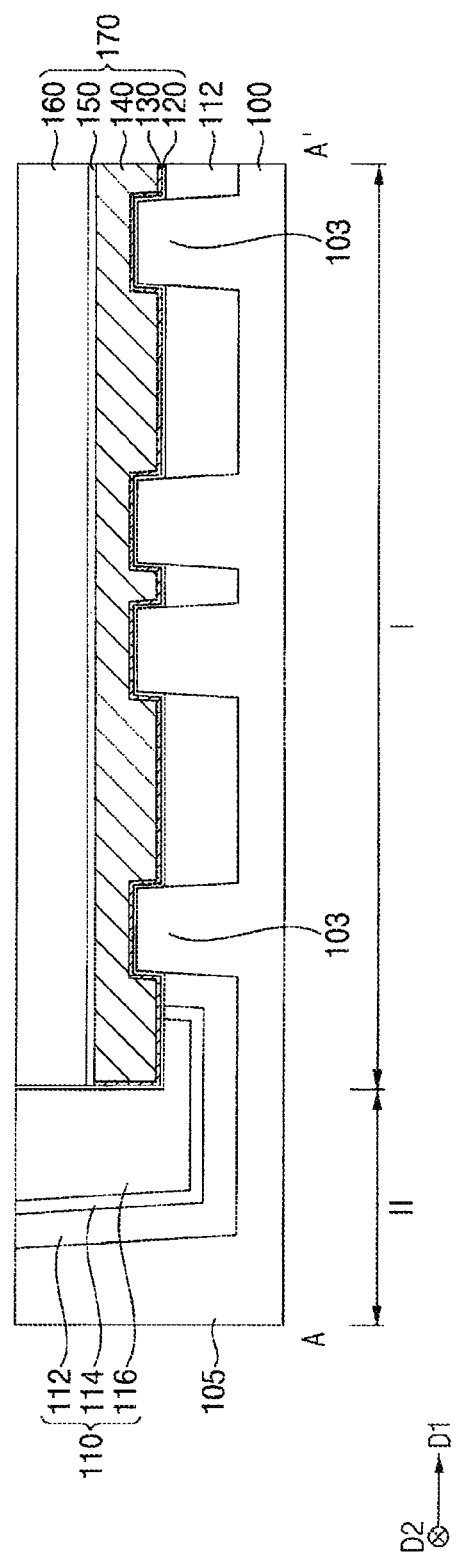
Figure 3:
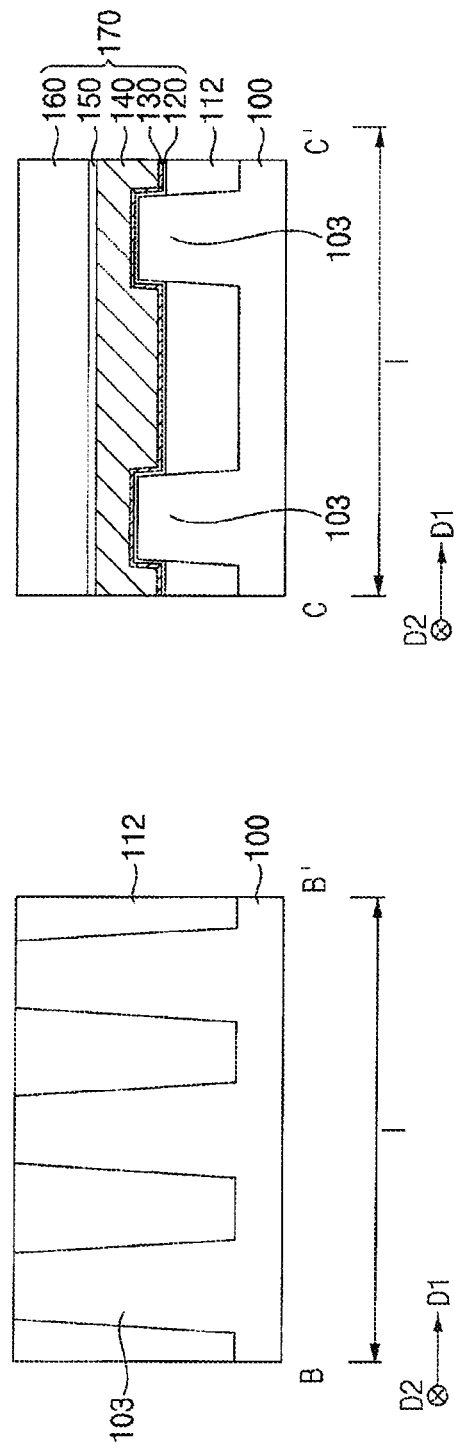

Referring to FIGS. 1 to 3, first and second active patterns 103 and 105 may be formed on the substrate 100. The substrate 100 may include first and second regions I and II, and an isolation pattern structure 110 may be formed to cover sidewalls of the first and second active patterns 103 and 105.

The substrate 100 may be or include a single-crystal semiconductor material that may be doped or undoped, and may at least one of silicon, germanium, silicon-germanium, or a III-V group compound semiconductor, such as GaP, GaAs, or GaSb. In some example embodiments, the substrate 100 may be a silicon-on-insulator (SOI) substrate or a germanium-on-insulator (GOI) substrate.

The first region I of the substrate 100 may be a cell region in which memory cells, such as one-transistor-one-capacitor (1T1C) memory cells, may be formed. The second region II of the substrate 100 may surround the first region I of the substrate 100, and may be a peripheral circuit region in which peripheral circuit patterns for driving, controlling, reading, or writing the memory cells may be formed.

The first and second active patterns 103 and 105 may be formed (or at least partially formed) by removing/etching an upper portion of the substrate 100 to form a first recess, and a plurality of first active patterns 103 each of which may extend in the third direction D3 may be spaced apart from each other in each of the first and second directions D1 and D2. Additionally, a plurality of second active patterns 105 may be spaced apart from each other in each of the first and second directions D1 and D2. In FIG. 1, two neighboring second active patterns 105 in the second direction D2 are shown.

In some example embodiments, the isolation pattern structure 110 may include first, second, and third division patterns 112, 114 and 116 sequentially stacked from an inner wall of the first recess. Ones of the first recesses that are formed on the first region I of the substrate 100 may have a relatively small width, and thus only the first division pattern 112 may be formed within the first region. However, ones of the first recesses that are formed on the second region II of the substrate 100 and/or on an area between the first and second regions I and II of the substrate may have a relatively large width, and thus all of, or more than one of, the first to third division patterns 112, 114 and 116 may be formed therein.

The first and third division patterns 112 and 116 may include an oxide, e.g., silicon oxide, and the second division pattern 114 may include a nitride, e.g., silicon nitride. The first to third division patterns 112 and 116 may not include a nitride, and the second division pattern 114 may not include an oxide.

The first active pattern 103 and the isolation pattern structure 110 on the first region I of the substrate 100 may be partially removed/partially etched to form a second recess extending in the first direction D1.

A first gate structure 170 may be formed in the second recess. The first gate structure 170 may include a first gate insulation pattern 120 on a bottom and a sidewall of the second recess, a first barrier pattern 130 on a portion of the first gate insulation pattern 120 on the bottom and a lower sidewall of the second recess, a first conductive pattern 140 on the first barrier pattern 130 and filling a lower portion of the second recess, a second conductive pattern 150 on upper surfaces of the first barrier pattern 130 and the first conductive pattern 140, and a first gate mask 160 on an upper surface of the second conductive pattern 150 and an upper inner sidewall of the first gate insulation pattern 120 and filling an upper portion of the second recess. The first barrier pattern 130, the first conductive pattern 140 and the second conductive pattern 150 altogether may form or be or correspond to a first gate electrode. In the first region I, the first gate electrode may correspond to a word line.

The first gate insulation pattern 120 may include an oxide, e.g., silicon oxide. The first barrier pattern 130 may include a metal nitride, e.g., at least one of titanium nitride, tantalum nitride, etc. The first conductive pattern 140 may include at least one of a metal, e.g., tungsten, a metal nitride, e.g., titanium nitride, tantalum nitride, etc., a metal silicide, doped polysilicon, etc. The second conductive pattern 150 may include doped polysilicon. The first gate mask 160 may include a nitride, e.g., silicon nitride. The first gate mask 160 may also be referred to as a capping layer.

Alternatively, the first gate structure 170 might not include the first barrier pattern 130, and may include the first gate insulation pattern 120, the first conductive pattern 140, the second conductive pattern 150 and the first gate mask 160.

In some example embodiments, the first gate structure 170 may extend in the first direction D1 on the first region I of the substrate 100, and a plurality of first gate structures 170 may be spaced apart from each other in the second direction D2. End portions of the first gate structure 170 in the first direction D1 may be aligned with each other in the second direction D2.

Figure 4:
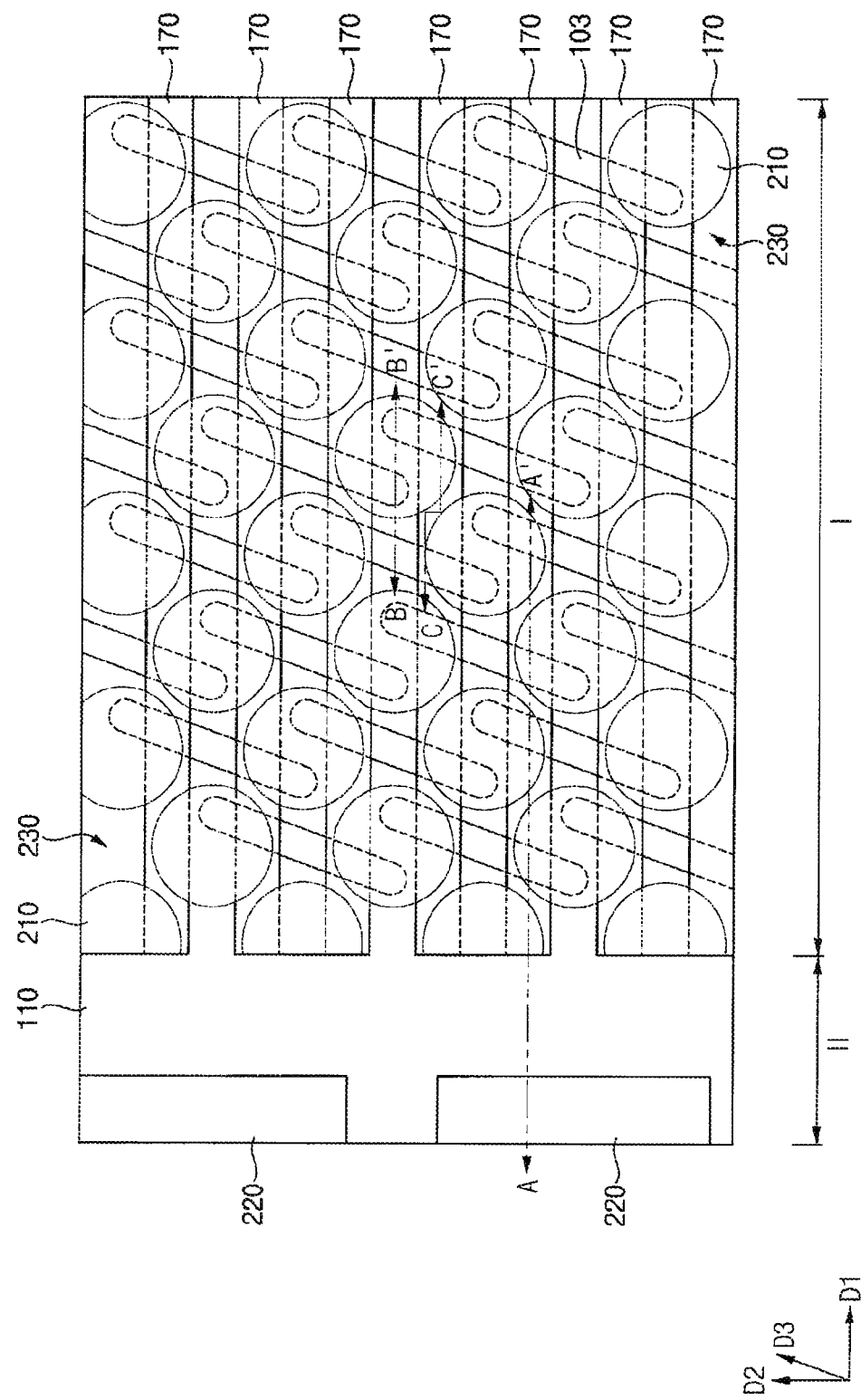
Figure 5:
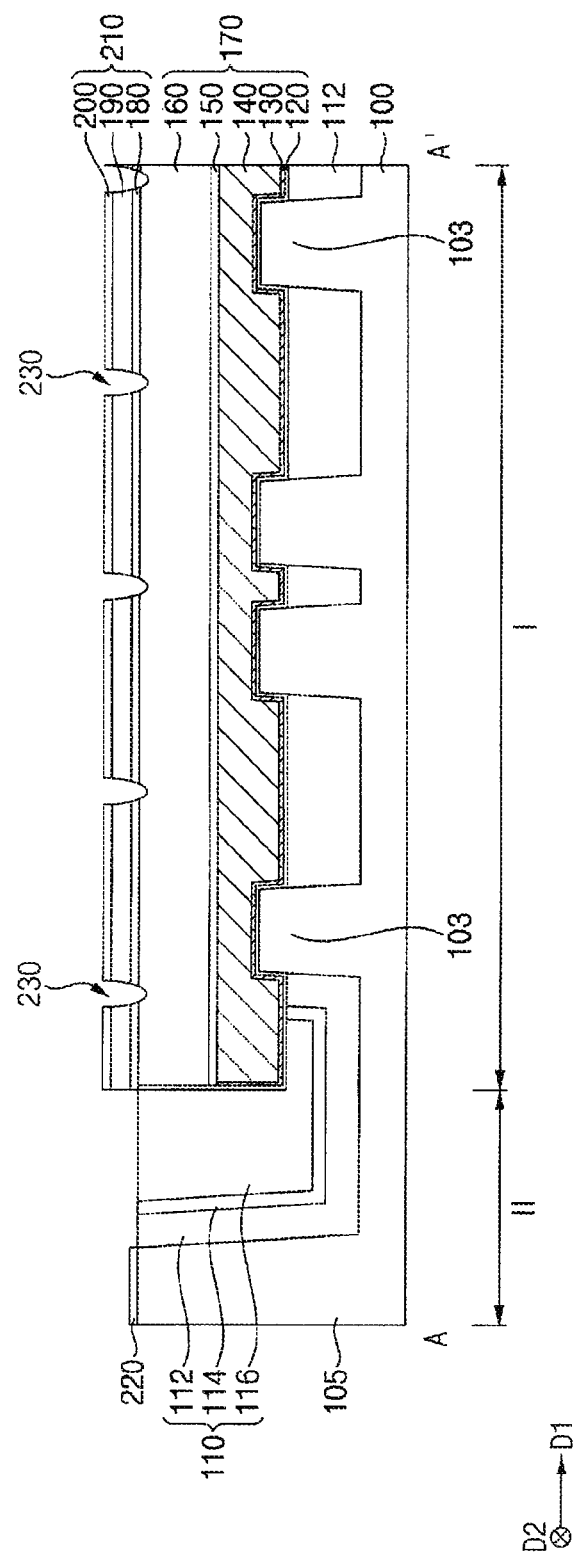
Figure 6:
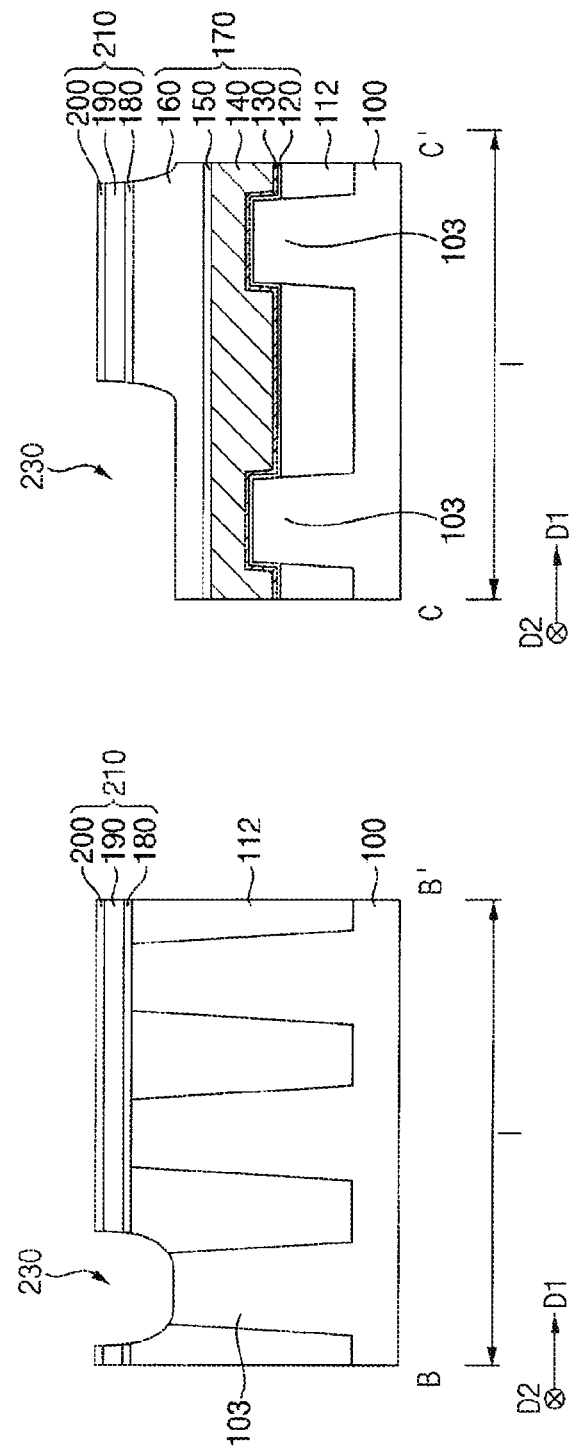

Referring to FIGS. 4 to 6, an insulation layer structure 210 may be formed on the first and second regions I and II of the substrate 100, a portion of the insulation layer structure 210 on the second region II of the substrate 100 may be removed/etched, and a second gate insulation layer 220 may be formed on the second active pattern 105 on the second region II of the substrate 100. The second gate insulation layer 220 may be formed by a deposition process and/or an oxidation process such as by, e.g., a thermal oxidation process and/or an in-situ steam generation (ISSG) process.

The insulation layer structure 210 may include first, second and third insulation layers 180, 190 and 200 sequentially stacked, the first and third insulation layers 180 and 200 may include an oxide, e.g., silicon oxide, and the second insulation layer 190 may include a nitride, e.g., silicon nitride. The insulation layer structure 210 may be formed with a deposition process such as with a chemical vapor deposition (CVD) process; however, example embodiments are not limited thereto.

The insulation layer structure 210 may be patterned, and the first active pattern 103, the isolation pattern structure 110, and the first gate mask 160 included in the first gate structure 170 may be partially etched using the patterned insulation layer structure 210 as an etching mask to form a first opening 230. The partial etching may be anisotropic, or may be isotropic. In some example embodiments, the insulation layer structure 210 remaining after the etching process may have a shape of a circle or ellipse in a plan view, and a plurality of insulation layer structures 210 may be spaced apart from each other in each of the first and second directions D1 and D2 on the first region I of the substrate 100. Each of the insulation layer structures 210 may overlap in a vertical direction substantially perpendicular to the upper surface of the substrate 100 end portions in the third direction D3 of the first active patterns 103 adjacent to each other.

Figure 7:
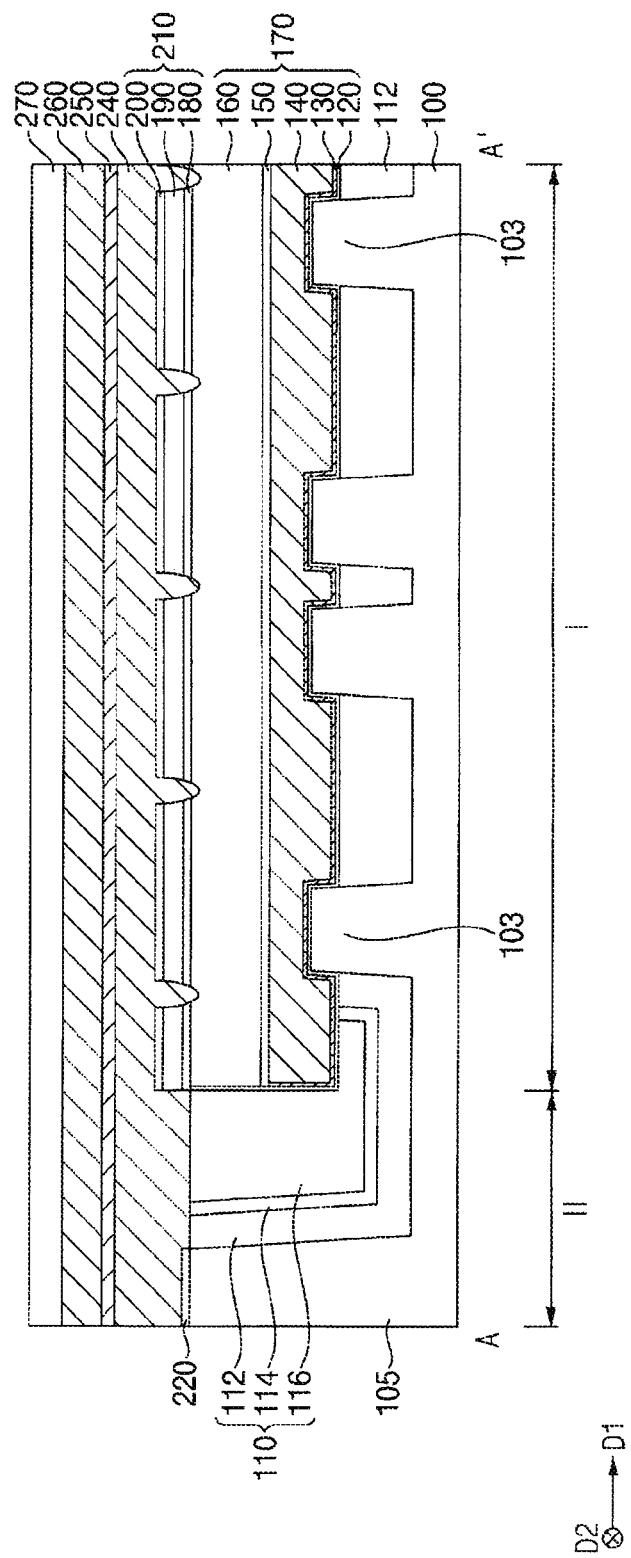
Figure 8:
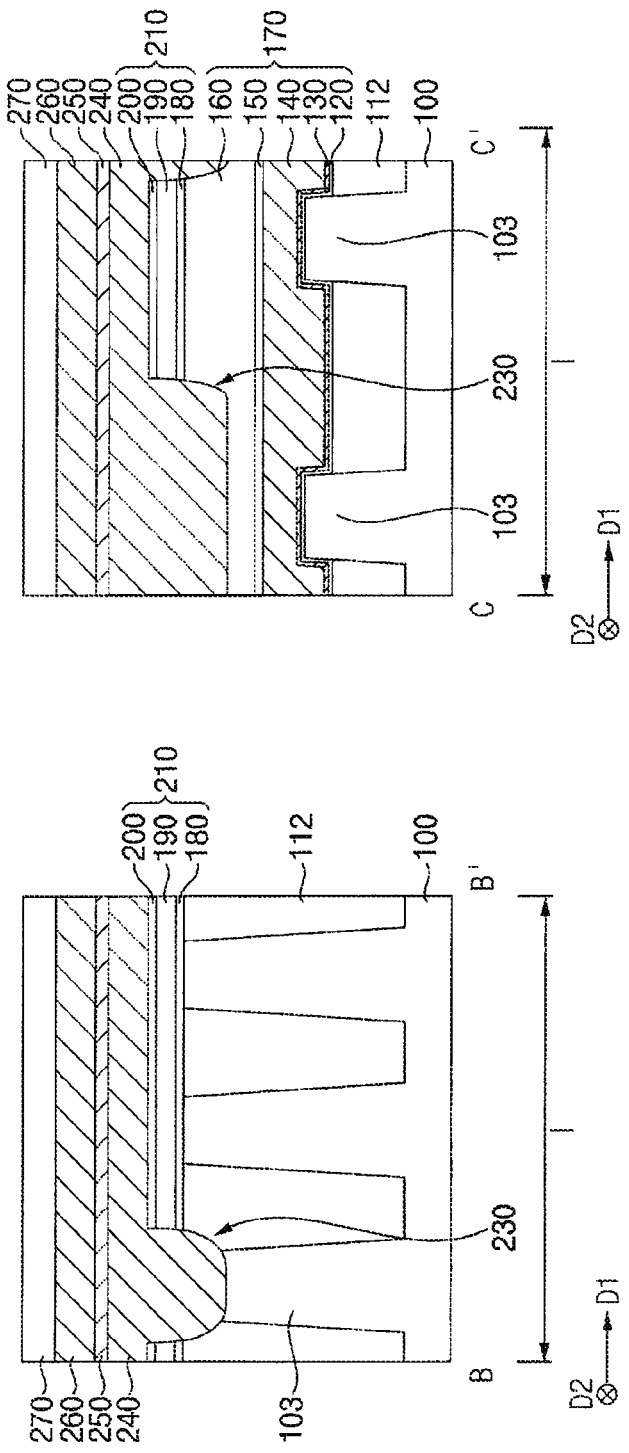

Referring to FIGS. 7 and 8, a third conductive layer 240, a second barrier layer 250, a fourth conductive layer 260 and a first mask layer 270 may be sequentially stacked on the insulation layer structure 210, the first active pattern 103 exposed by the first opening 230, the isolation pattern structure 110 and the first gate structure 170 on the first region I of the substrate 100, and the second gate insulation layer 220 and the isolation pattern structure 110 on the second region II of the substrate 100, which may form a conductive layer structure. The third conductive layer 240 may fill the first opening 230.

The third conductive layer 240 may include, e.g., polysilicon doped with at least one of boron, phosphorus, or arsenic, the second barrier layer 250 may include a metal silicon nitride, e.g., titanium silicon nitride, the fourth conductive layer 260 may include a metal, e.g., tungsten, and the first mask layer 270 may include a nitride, e.g., silicon nitride.

Figure 9:
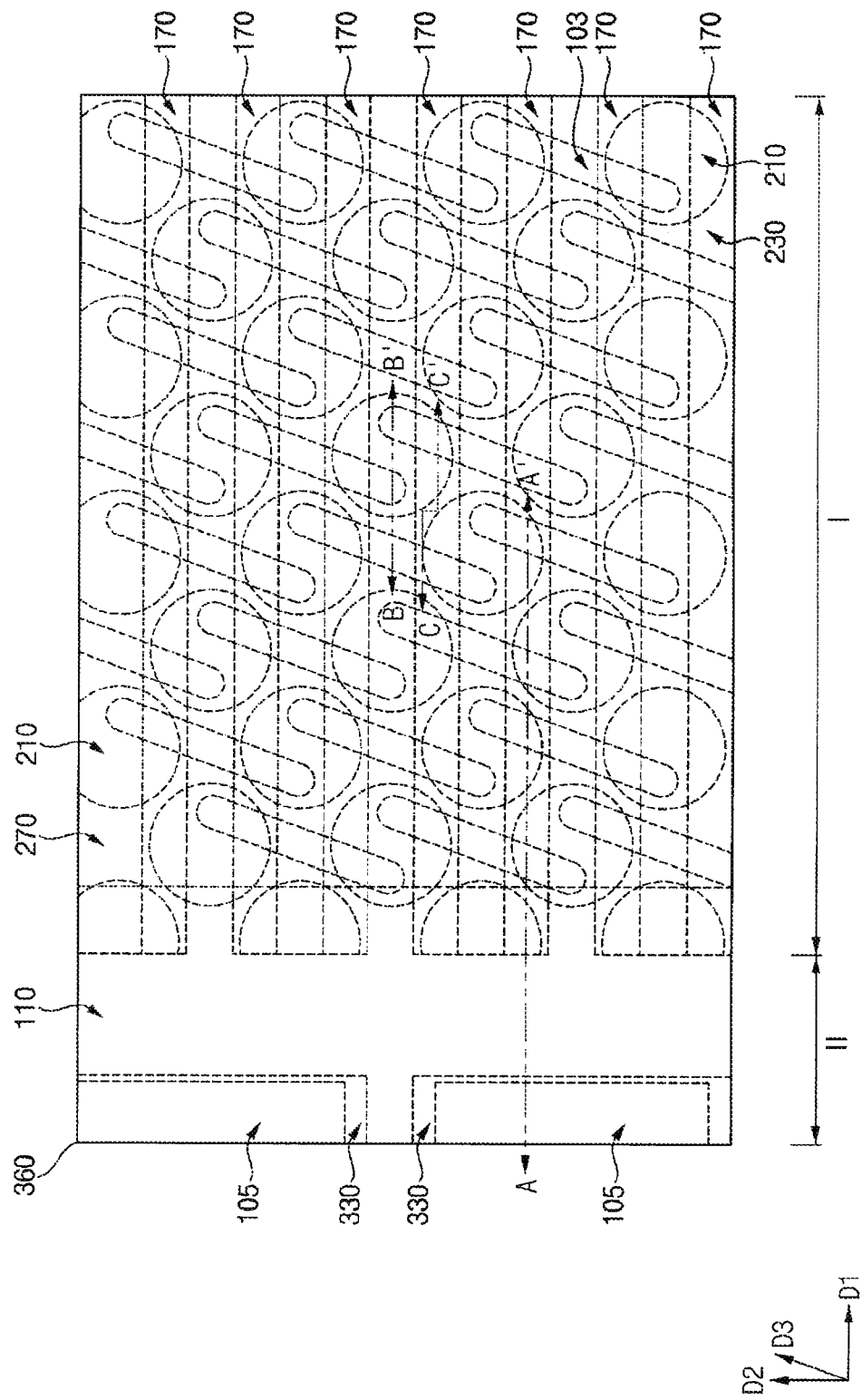
Figure 10:
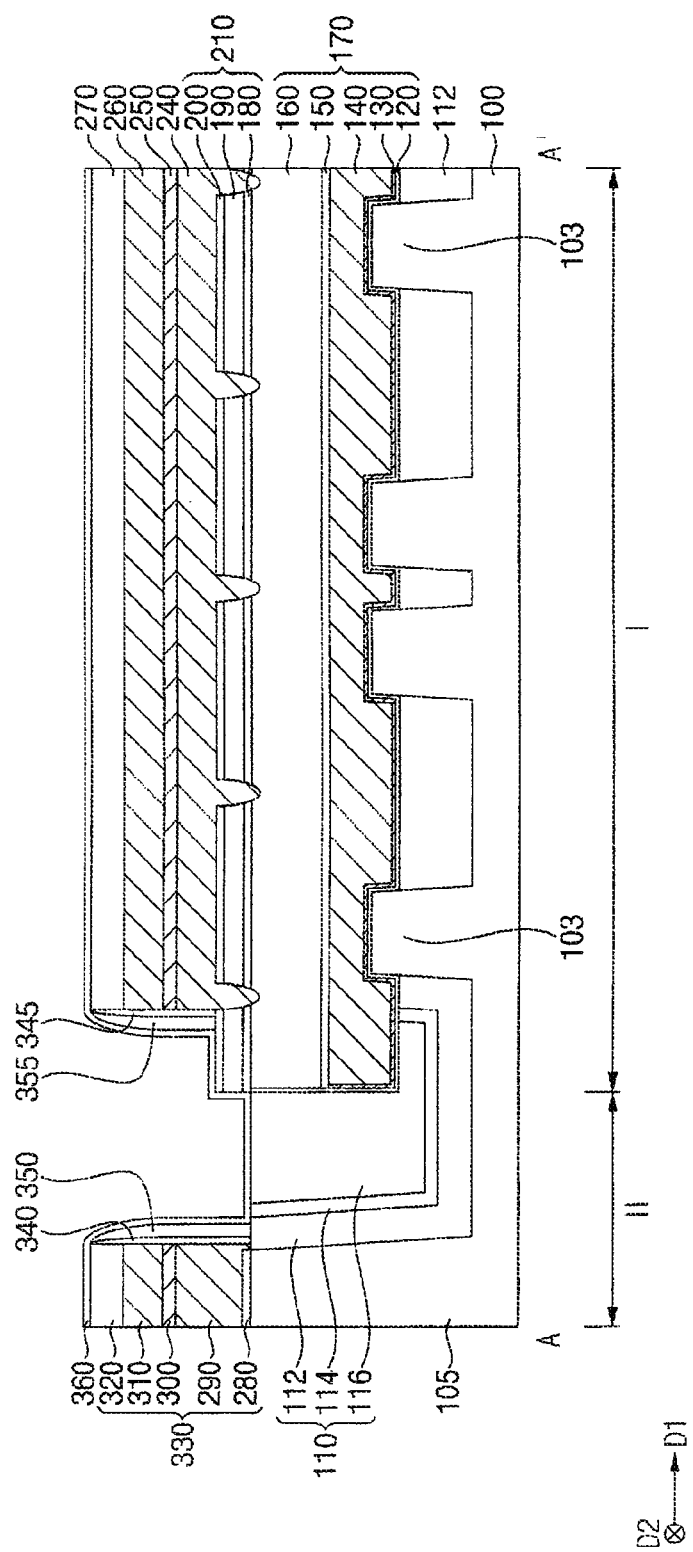
Figure 11:
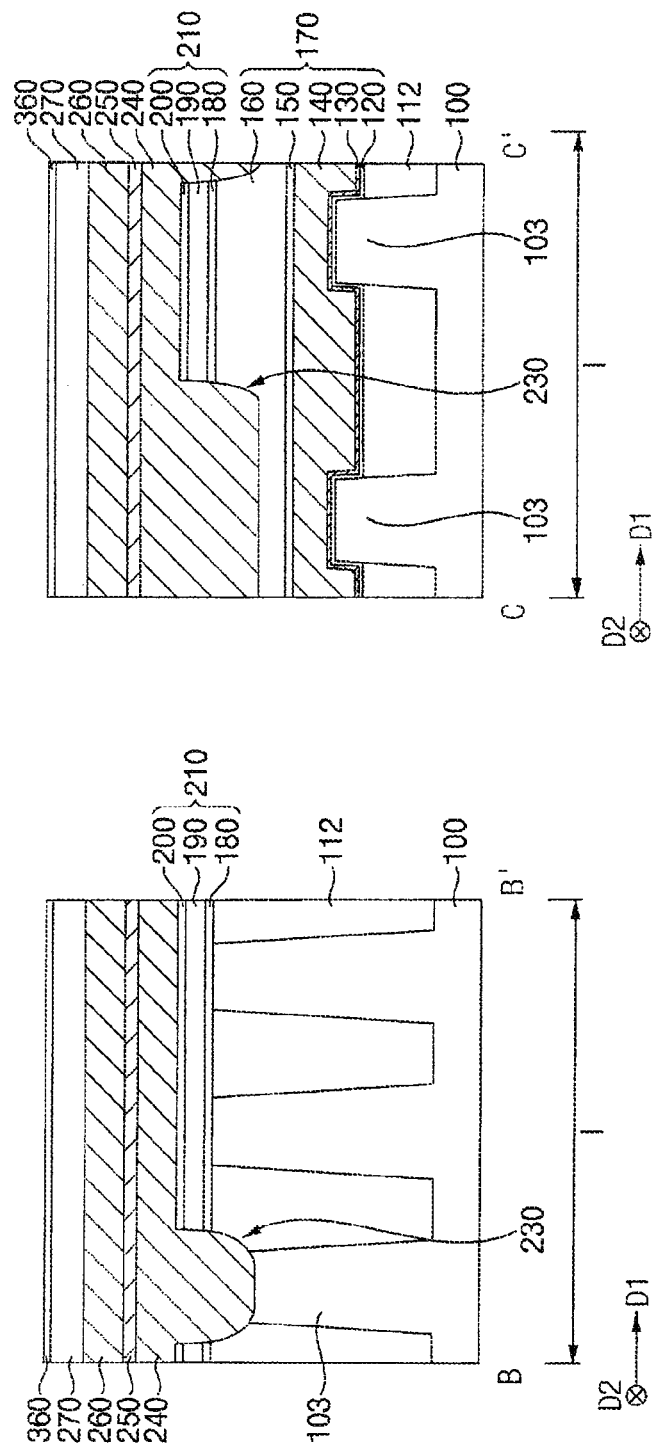

Referring to FIGS. 9 to 11, the conductive layer structure may be patterned to form a second gate structure 330 on the second region II of the substrate 100.

The second gate structure 330 may include a second gate insulation pattern 280, a third conductive pattern 290, a second barrier pattern 300, a fourth conductive pattern 310 and a second gate mask 320 that are sequentially stacked in the vertical direction, and the third conductive pattern 290, the second barrier pattern 300 and the fourth conductive pattern 310 may form a second gate electrode. The second gate electrode may correspond to a periphery gate.

The second gate structure 330 may partially overlap the second active pattern 105 in the vertical direction on the second region II of the substrate 100. In the drawings, e.g. FIG. 9, two second gate structures 330 spaced apart from each other in the second direction D2 are shown, however, inventive concepts may not be limited thereto.

Additionally, a portion of the conductive layer structure on an edge portion of the first region I of the substrate 100 adjacent to the second region II of the substrate 100 may be removed/etched, and thus the insulation layer structure 210, and the first active pattern 103, the isolation pattern structure 110 and the first gate structure 170 exposed by the first opening 230 may be also partially exposed.

A first spacer structure may be formed on a sidewall of the second gate structure 330, and simultaneously and/or before and/or afterwards a second spacer structure may be formed on a sidewall of the conductive layer structure remaining on the first region I of the substrate 100. The first spacer structure may include first and third gate spacers 340 and 350 sequentially stacked in a horizontal direction substantially parallel to the upper surface of the substrate 100 from the sidewall of the second gate structure 330, and the second spacer structure may include second and fourth spacers 345 and 355 sequentially stacked in the horizontal direction from the sidewall of the conductive layer structure.

The first and second spacers 340 and 345 may be formed by forming a first spacer layer on the substrate 100 having the conductive layer structure and the second gate structure 330 thereon, and anisotropically etching the first spacer layer. The third and fourth spacers 350 and 355 may be formed by forming a second spacer layer on the substrate 100 having the conductive layer structure, the second gate structure, and the first and second spacers 340 and 345 thereon, and anisotropically etching the first spacer layer.

The first and second spacers 340 and 345 may include a nitride, e.g., silicon nitride and may be formed at the same time and/or at different times with each other, and the third and fourth spacers 350 and 355 may include an oxide, e.g., silicon oxide and may be formed at the same time and/or at different times with each other.

However, inventive concepts may not be limited thereto, and each of the first and second spacer structures may include a single spacer or more than two spacers sequentially stacked.

A first etch stop layer 360 may be formed, e.g. conformally formed, on the substrate 100 having the conductive layer structure, the second gate structure 330, the first and second spacer structures, and the isolation pattern structure 110. The first etch stop layer 360 may include a nitride, e.g., silicon nitride.

Figure 12:
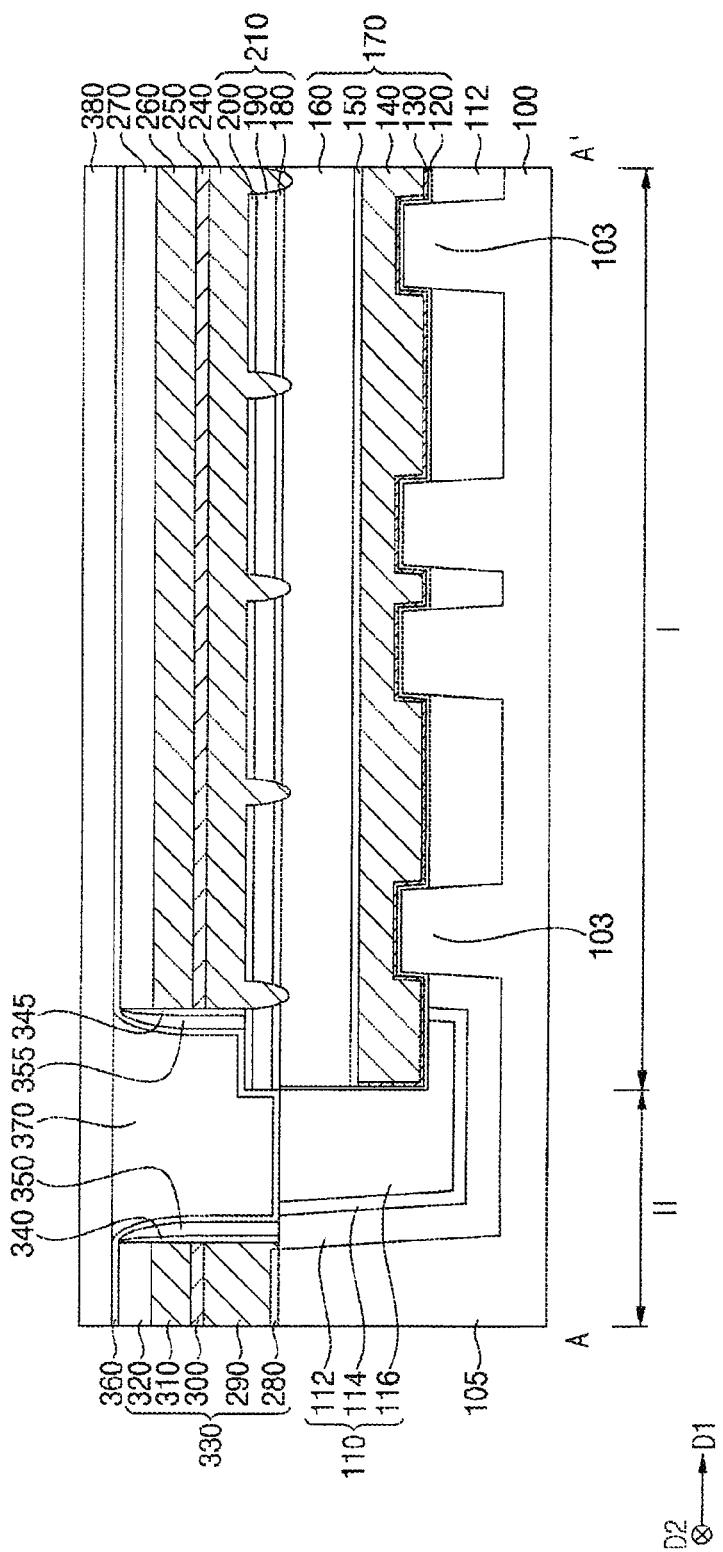

Referring to FIG. 12, a first insulating interlayer 370 may be formed on the first etch stop layer 360, an upper portion of the first insulating interlayer 370 may be planarized with at least one of a chemical mechanical planarization (CMP) process or an etch-back process until an upper surface of the first etch stop layer 360 on an upper surface of the second gate structure 330 and an upper surface of the conductive layer structure is exposed, and a first capping layer 380 may be formed on the first insulating interlayer 370 and the first etch stop layer 360.

Thus, the first insulating interlayer 370 may fill a space between the first spacer structures on the sidewalls of the second gate structures 330, and a space between the first spacer structure on the sidewall of the second gate structure 330 and the second spacer structure on the sidewall of the conductive layer structure.

The first insulating interlayer 370 may include an oxide, e.g., silicon oxide, and may not include a nitride, and the first capping layer 380 may include a nitride, e.g., silicon nitride, and may not include an oxide.

Figure 13:
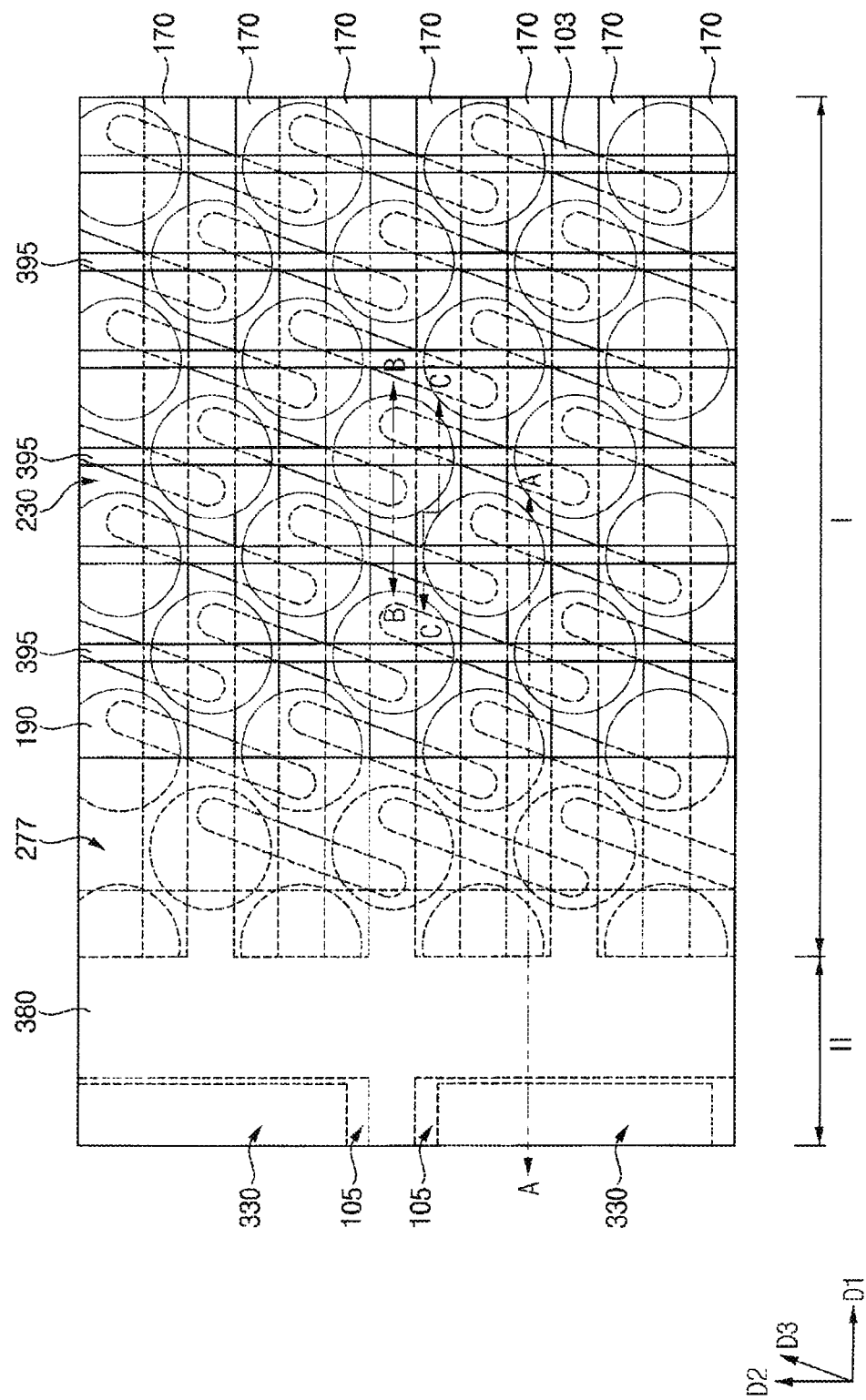
Figure 14:
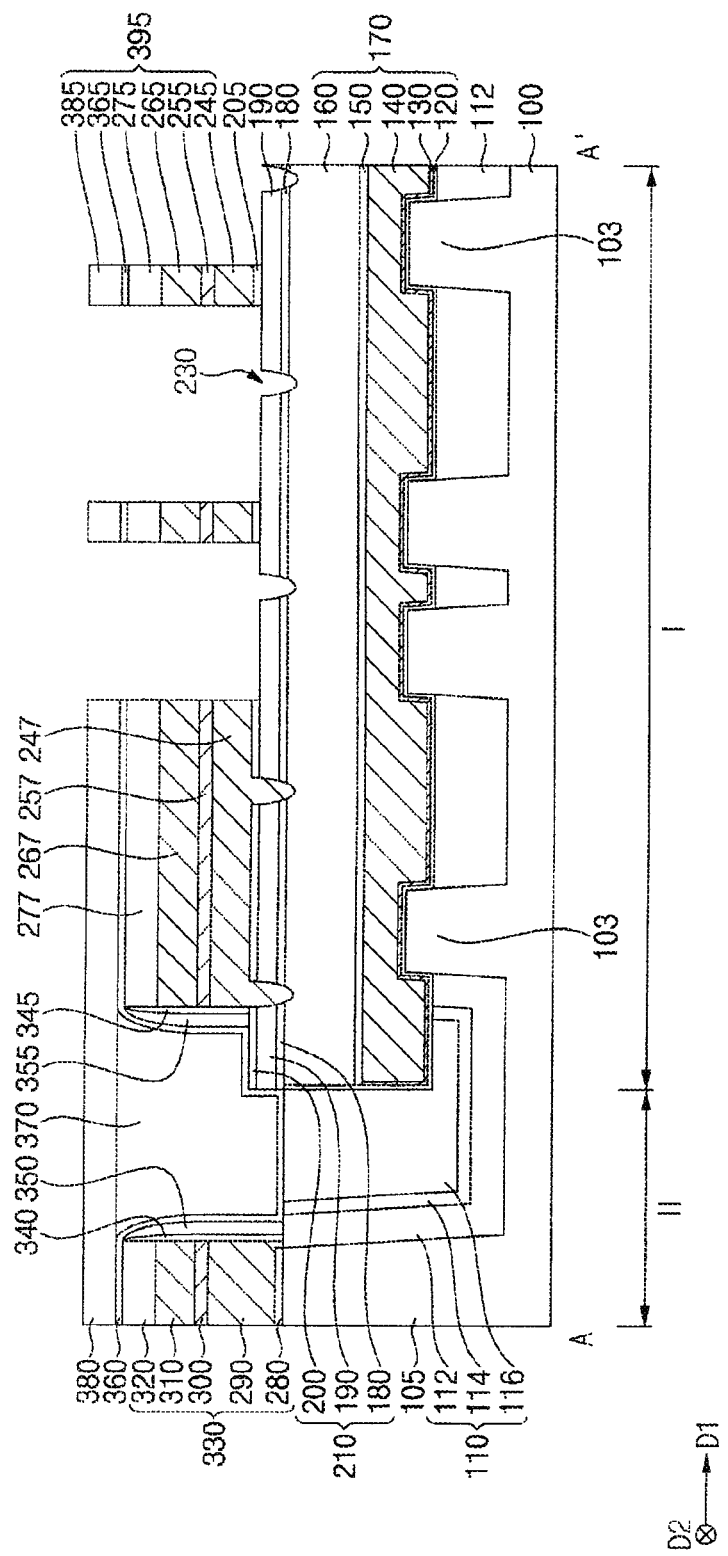
Figure 15:
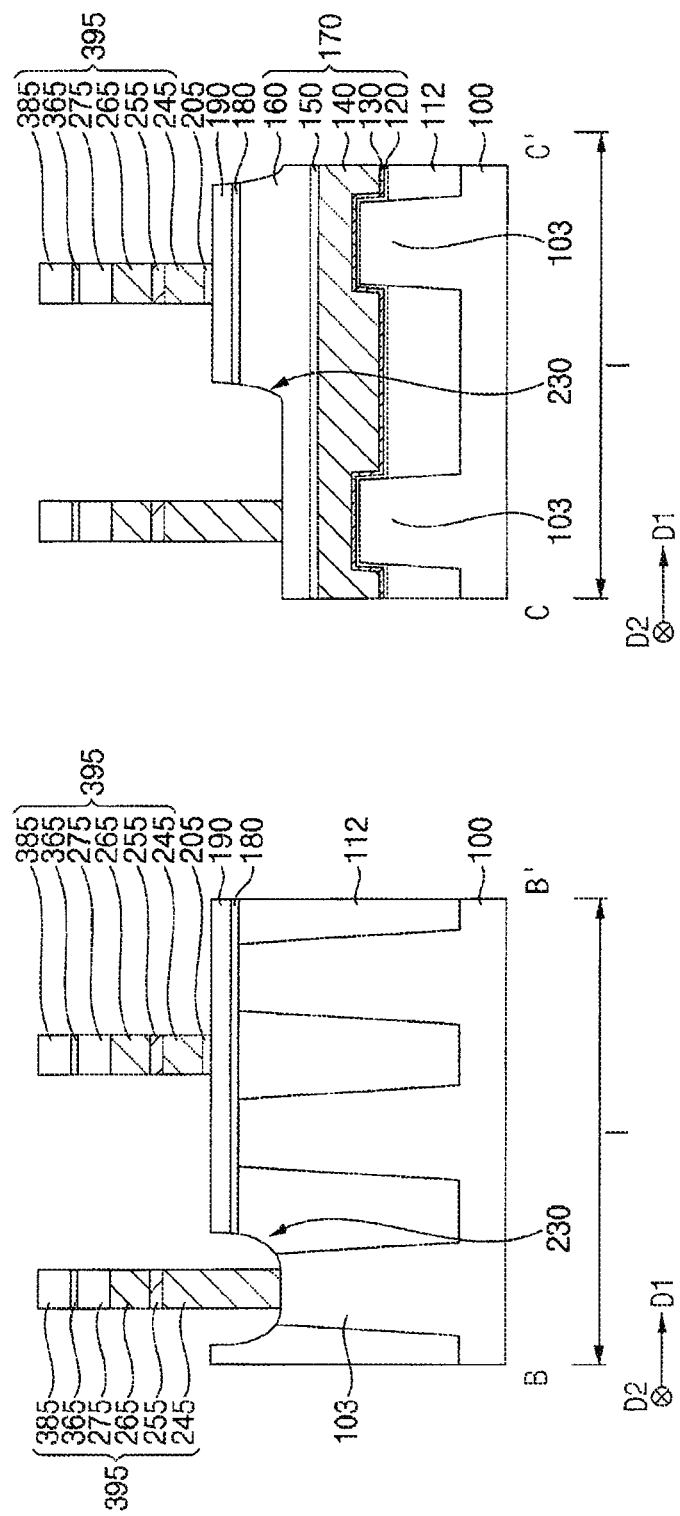

Referring to FIGS. 13 to 15, a portion of the first capping layer 380 on the first region I of the substrate 100 may be etched to form a first capping pattern 385, and the first etch stop layer 360, the first mask layer 270, the fourth conductive layer 260, the second barrier layer 250, and the third conductive layer 240 may be sequentially etched using the first capping pattern 385 as an etching mask.

In some example embodiments, a plurality of first capping patterns 385 each of which may extend in the second direction D2 may be spaced apart from each other in the first direction D1 on the first region I of the substrate 100. The first capping layer 380 may remain on the second region II of the substrate 100.

By the etching process, on the first region I of the substrate 100, a fifth conductive pattern 245, a third barrier pattern 255, a sixth conductive pattern 265, a first mask 275, a first etch stop pattern 365, and a first capping pattern 385 may be sequentially stacked on the first opening 230, and a third insulation pattern 205, the fifth conductive pattern 245, the third barrier pattern 255, the sixth conductive pattern 265, the first mask 275, the first etch stop pattern 365, and the first capping pattern 385 may be sequentially stacked on the second insulation layer 190 at an outside of the first opening 230.

Hereinafter, the fifth conductive pattern 245, the third barrier pattern 255, the sixth conductive pattern 265, the first mask 275, the first etch stop pattern 365 and the first capping pattern 385 sequentially stacked may be referred to as a bit line structure 395. The bit line structure 395 may also be referred to as the column line. In some example embodiments, the bit line structure 395 may extend in the second direction D2 on the first region I of the substrate 100, and a plurality of bit line structures 395 may be spaced apart from each other in the first direction D1.

On a portion of the first region I of the substrate 100 adjacent to/near to/at the border with the second region II of the substrate 100 in the first direction D1, a dummy bit line structure extending in the second direction D2 and including a seventh conductive pattern 247, a fourth barrier pattern 257, an eighth conductive pattern 267 and a second mask 277 sequentially stacked may be formed, and the first etch stop layer 360 may remain on the second gate structure 330, the dummy bit line structure, the first and second spacer structures, a portion of the insulation layer structure 210, and the isolation pattern structure 110. Additionally, the first capping layer 380 may remain on the portion of the first etch stop layer 360 on the second gate structure 330 and the dummy bit line structure, and the first insulating interlayer 370. The dummy bit line structure may not be electrically active, e.g. may be floating, during operation of the semiconductor device.

Figure 16:
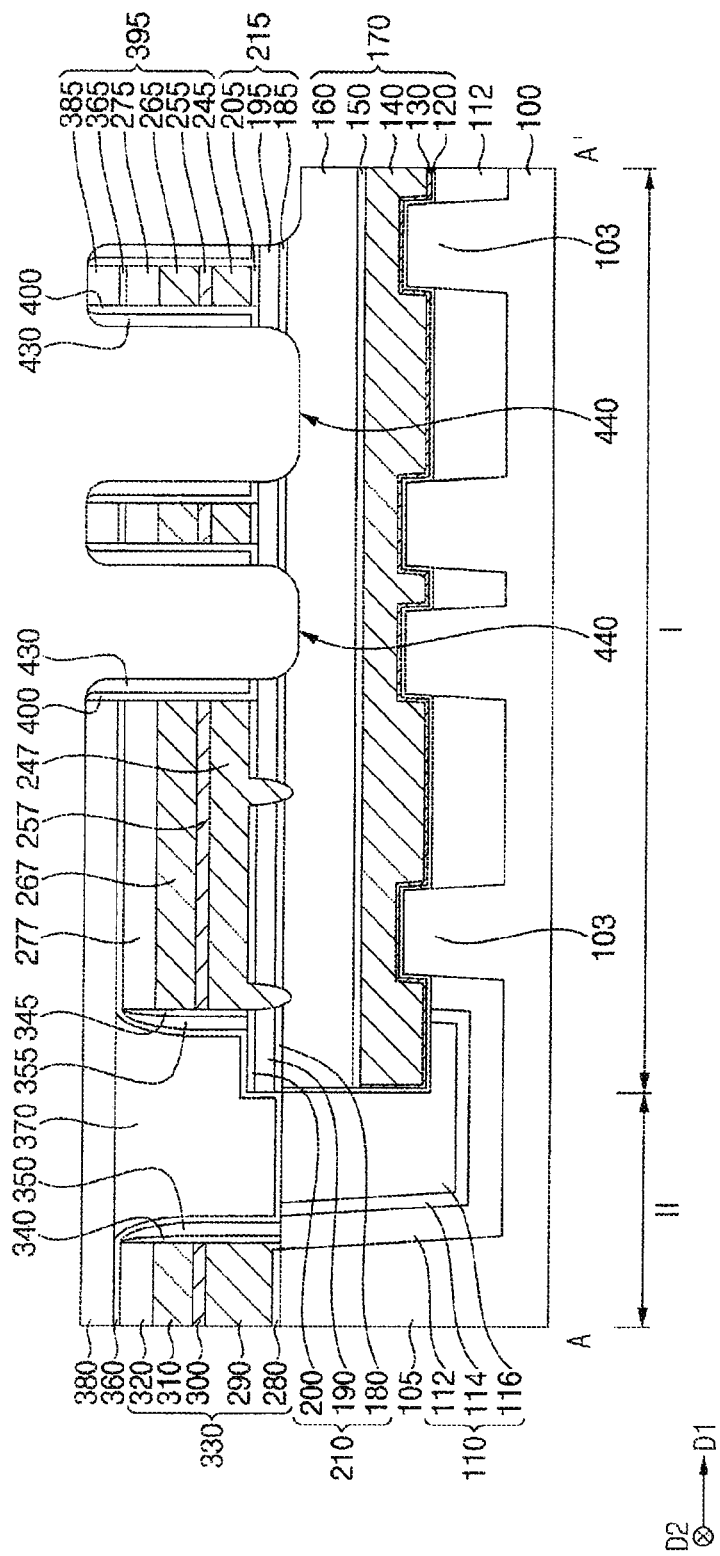
Figure 17:
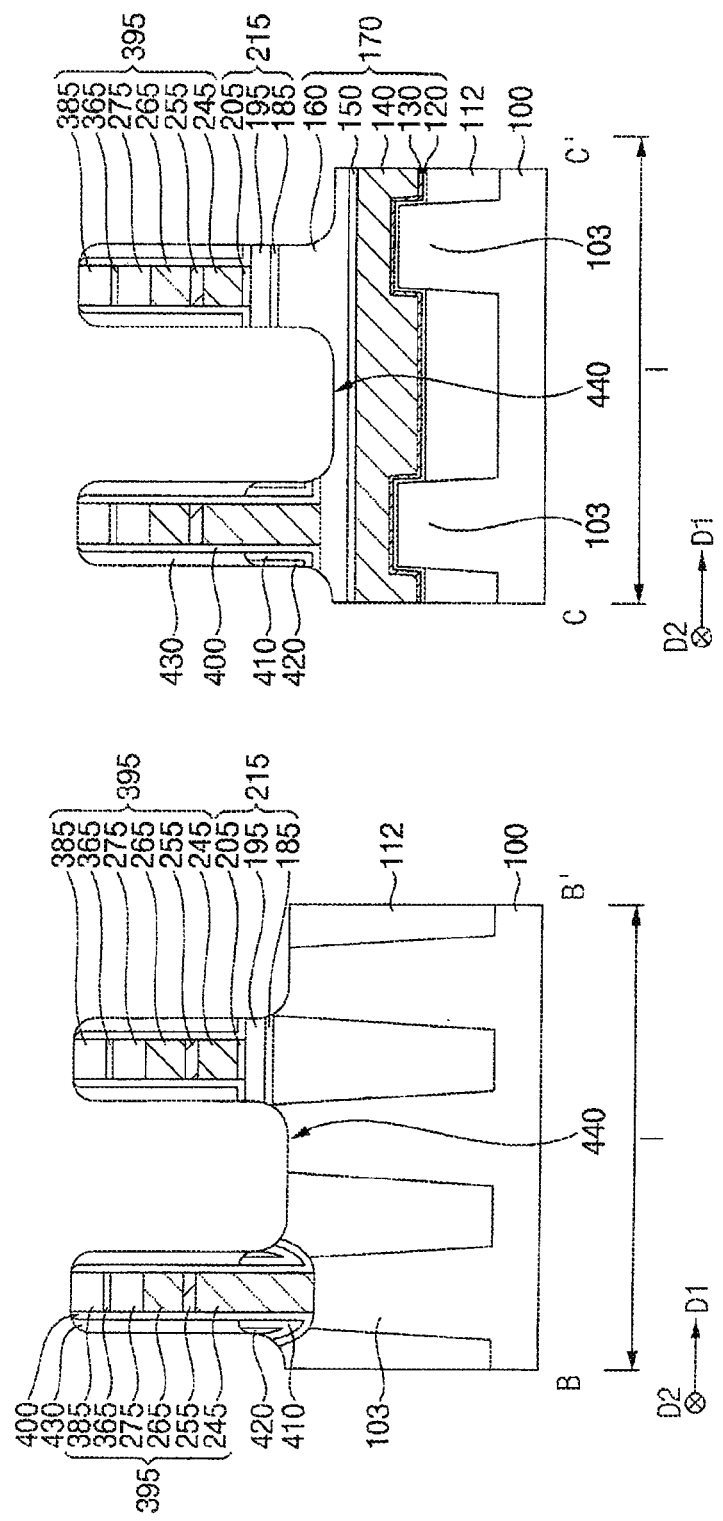

Referring to FIGS. 16 and 17, a fifth spacer layer may be formed on the substrate 100 having the bit line structure 395, the dummy bit line structure and the first capping layer 380 thereon, and fourth and fifth insulation layers may be sequentially formed on the fifth spacer layer.

The fifth spacer layer may cover a sidewall of the third insulation pattern 205 under a portion of the bit line structure 395 on the second insulation layer 190, and the fifth insulation layer may fill a remaining portion of the first opening 230.

The fifth spacer layer may include a nitride, e.g., silicon nitride, and may not include an oxide, the fourth insulation layer may include an oxide, e.g., silicon oxide, and may not include a nitride, and the fifth insulation layer may include a nitride, e.g., silicon nitride, and may not include an oxide.

The fourth and fifth insulation layers may be etched by an etching process. In some example embodiments, the etching process may be performed by a wet etching processes using (hot) phosphoric acid ($H_3PO_4$), SC1 solution such as a solution of deionized water, ammonia, and hydrogen peroxide, and hydrogen fluoride (HF) as an etching solution, and thus all portions of the fourth and fifth insulation layers except for a portion thereof in the first opening 230 may be removed. Accordingly, almost the entire surface of the fifth spacer layer, that is, the entire surface of the fifth spacer layer except for the surface in the first opening 230 may be exposed, and the fourth and fifth insulation layers remaining in the first opening 230 may be transformed into fourth and fifth insulation patterns 410 and 420, respectively.

A sixth spacer layer may be formed on the fourth and fifth insulation patterns 410 and 420 on the exposed surface of the fifth spacer layer and in the first opening 230, and may be anisotropically etched (e.g. using a reactive ion etch) to form a sixth spacer 430 covering a sidewall of the bit line structure 395 on the surface of the fifth spacer layer and the fourth and fifth insulation patterns 410 and 420. The sixth spacer 430 may also be formed on the sidewall of the dummy bit line structure. The sixth spacer layer may include an oxide, e.g., silicon oxide.

A dry etching process (e.g. a reactive ion etching process) may be performed using the first capping pattern 385 and the sixth spacer 430 as an etching mask to form a second opening 440 exposing an upper surface of the first active pattern 103, and an upper surface of the isolation pattern structure 110 and an upper surface of the first gate mask 160 may also be exposed by the second opening 440.

By the dry etching process, portions of the fifth spacer layer on the upper surfaces of the first capping pattern 385, the second insulation layer 190 and the first capping layer 380 may be removed, and thus a fifth spacer 400 may be formed to cover the sidewall of the bit line structure 395. The fifth spacer 400 may also cover the sidewall of the dummy bit line structure.

Additionally, by the dry etching process, the first and second insulation layers 180 and 190 may be partially removed so as to remain under the bit line structure 395 as first and second insulation patterns 185 and 195, respectively. The first to third insulation patterns 185, 195 and 205 sequentially stacked under the bit line structure 395 may form an insulation pattern structure.

Figure 18:
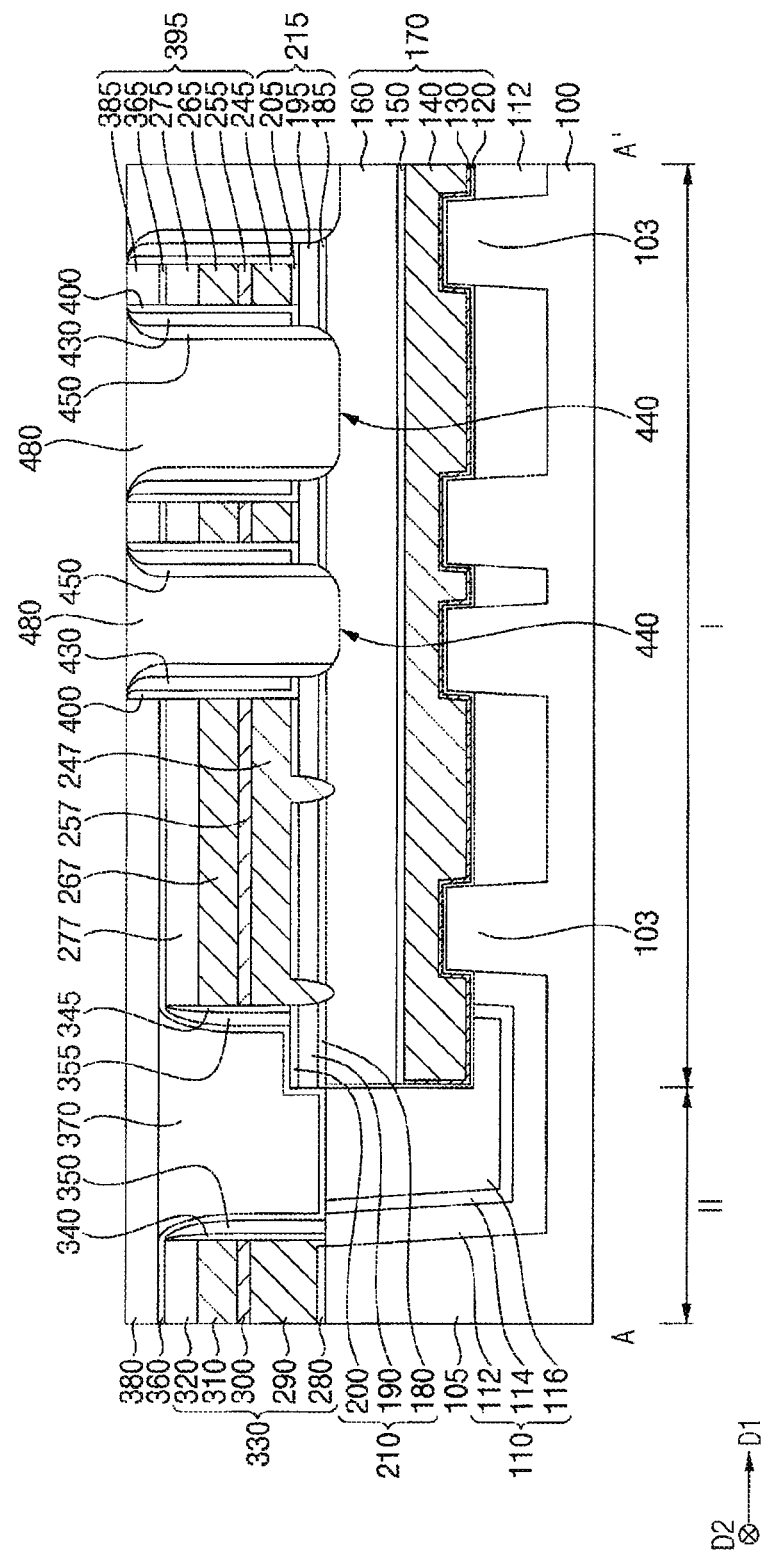
Figure 19:
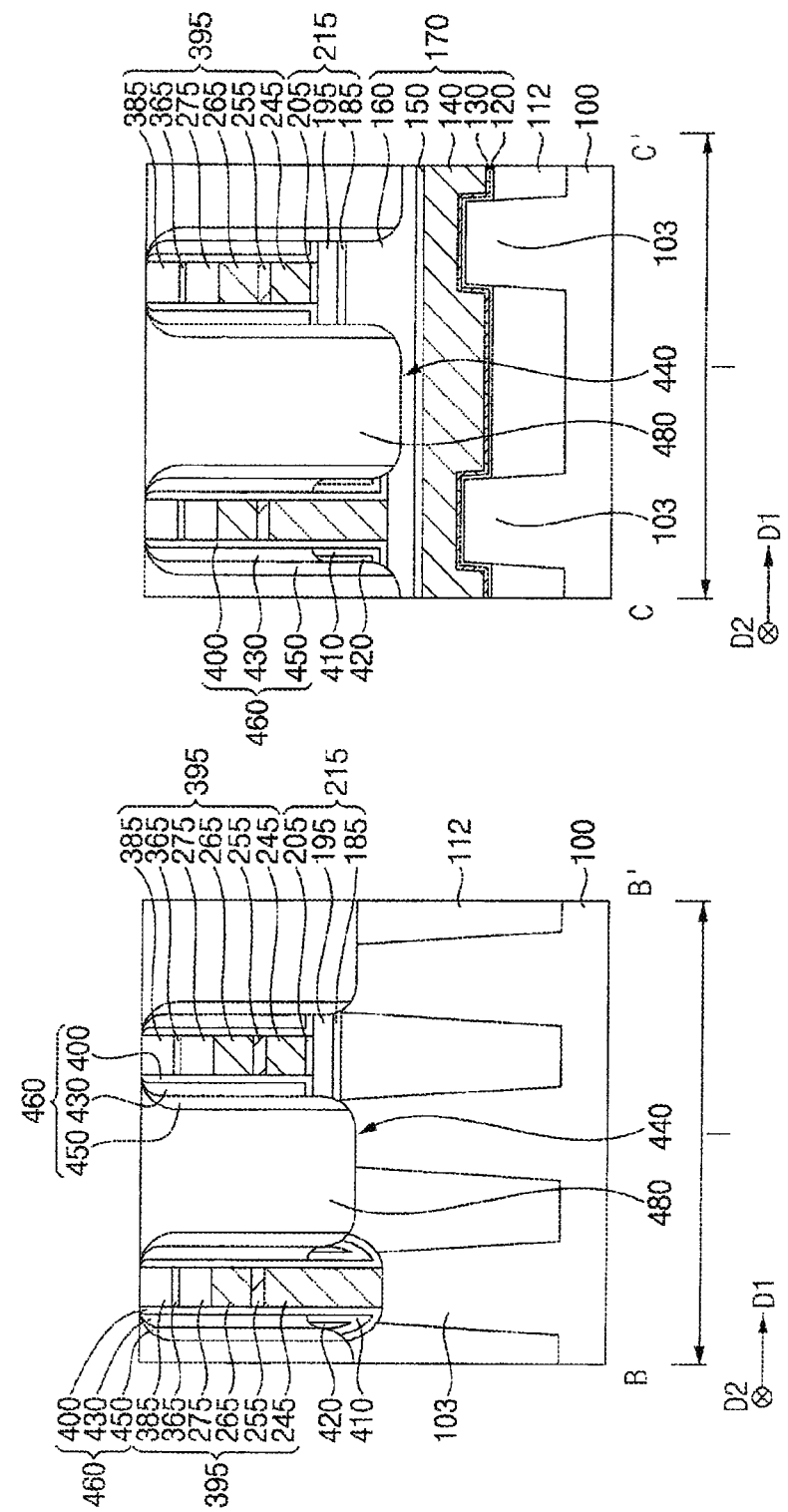

Referring to FIGS. 18 and 19, a seventh spacer layer may be formed on the upper surface of the first capping pattern 385, the upper surface of the first capping layer 380, an outer sidewall of the sixth spacer 430, upper surfaces of the fourth and fifth insulation patterns 410 and 420, and the upper surfaces of the first active pattern 103, the isolation pattern structure 11,0 and the first gate mask 160 exposed by the second opening 440, and anisotropically etched to form a seventh spacer 450 covering the sidewall of the bit line structure 395. The seventh spacer layer may include a nitride, e.g., silicon nitride.

The fifth to seventh spacers 400, 430 and 450 sequentially stacked in the horizontal direction from the sidewall of the bit line structure 395 on the first region I of the substrate 100 may be referred to as a preliminary third spacer structure 460.

A second capping pattern 480 may be formed on the first region I of the substrate 100 to fill the second opening 440, and may be planarized until the upper surfaces of the first capping pattern 385 and the first capping layer 380 are exposed. In some example embodiments, the second capping pattern 480 may extend in the second direction D2, and a plurality of second capping patterns 480 may be spaced apart from each other by the bit line structures 395 in the first direction D1. The second capping pattern 480 may include a nitride, e.g., silicon nitride.

Figure 20:
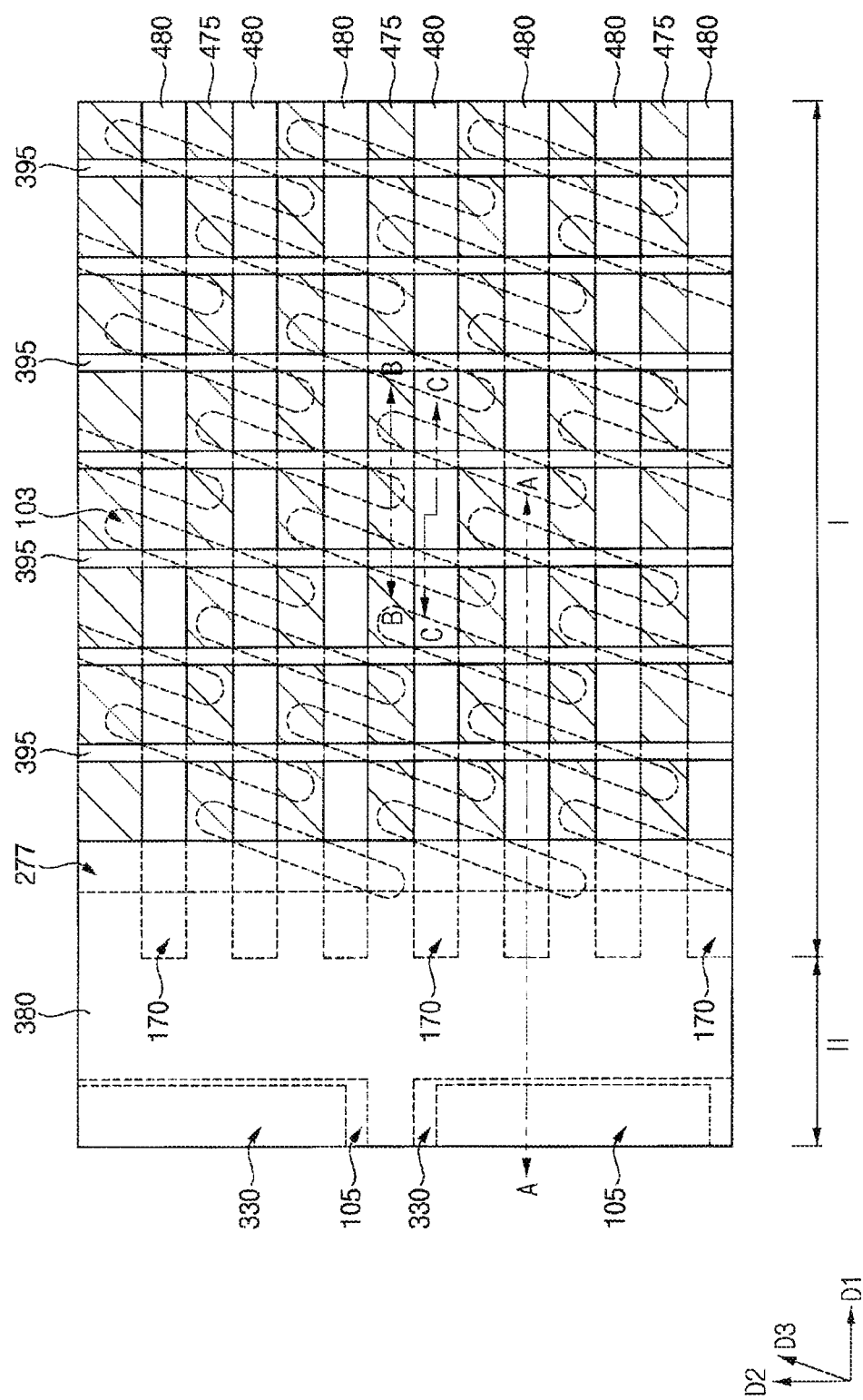
Figure 21:
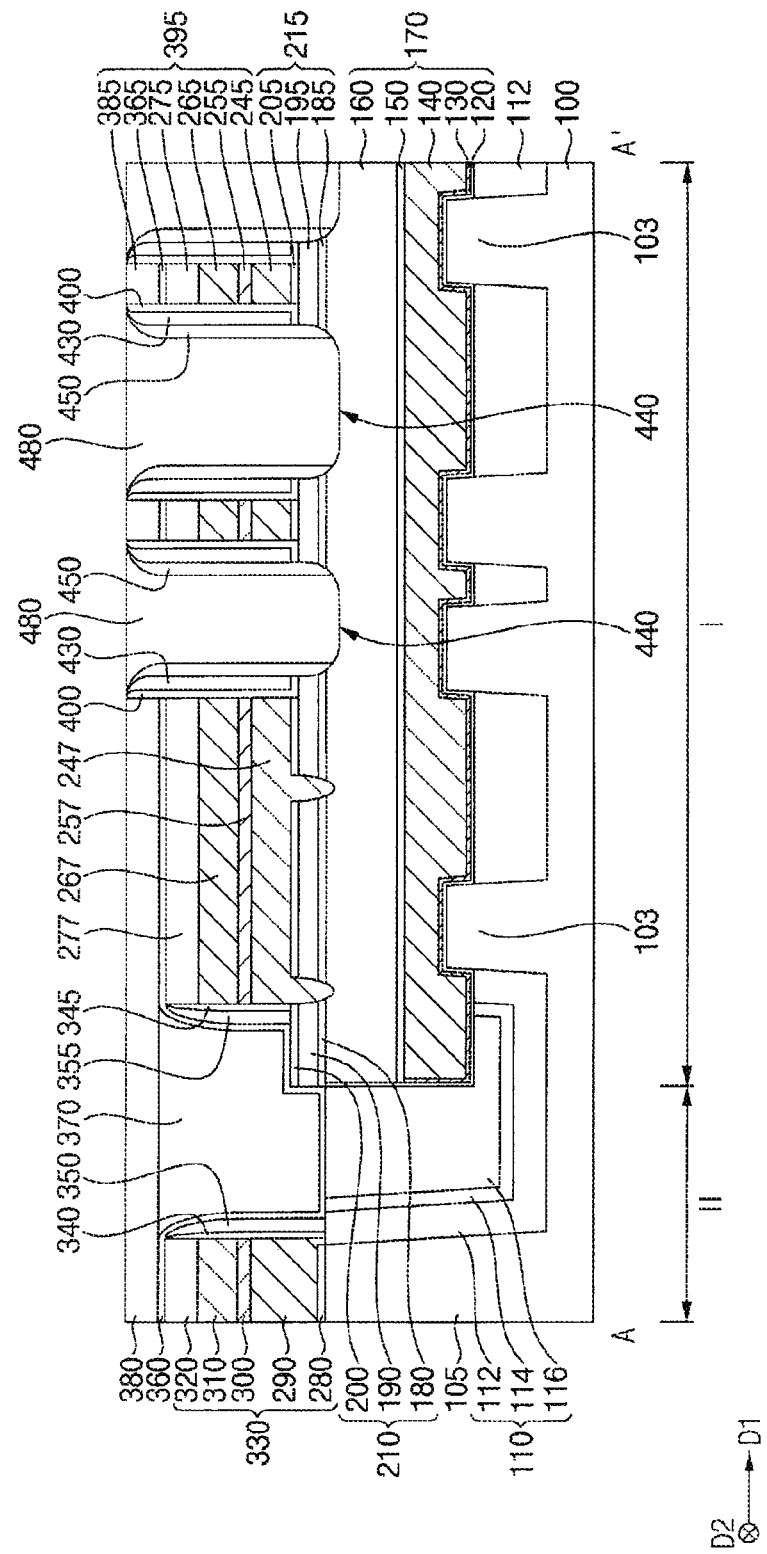
Figure 22:
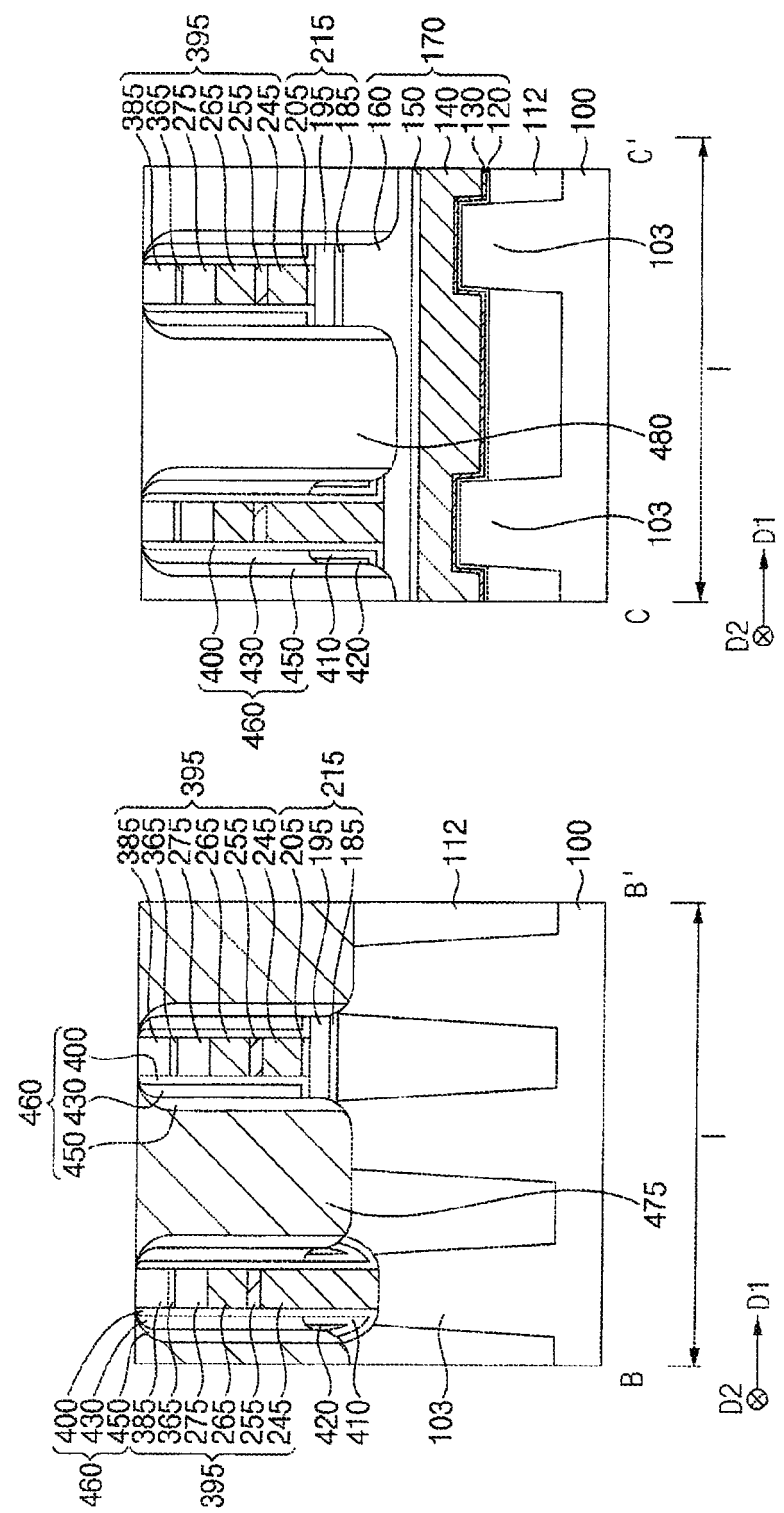

Referring to FIGS. 20 to 22, a third mask having a plurality of third openings each of which may extend in the first direction D1 spaced apart from each other in the second direction D2 on the first region I of the substrate 100 may be formed on the first capping pattern 385, the first capping layer 380 and the second capping pattern 480, and the second capping pattern 480 may be etched using the third mask as an etching mask.

In some example embodiments, each of the third openings may overlap the first gate structure 170 in the vertical direction on the first region I of the substrate 100. By the etching process, a fourth opening may be formed on the first region I of the substrate 100 to expose an upper surface of the first gate mask 160 of the first gate structure 170 between the bit line structures 395.

After removing the third mask, a lower contact plug layer may be formed to fill the fourth opening, and may be planarized until the upper surfaces of the first and second capping patterns 385 and 480 and the first capping layer 380 are exposed. Thus, the lower contact plug layer may be divided into a plurality of lower contact plugs 475 each of which may extend in the first direction D1 between the bit line structures 395 spaced apart from each other in the second direction D2. Additionally, the second capping pattern 480 each of which may extend in the second direction D2 between the bit line structures 395 may be divided into a plurality of parts spaced apart from each other by the lower contact plugs 475 in the second direction D2.

The lower contact plug layer 470 may include, e.g., polysilicon doped with at least one of boron, phosphorus, or arsenic.

Figure 23:
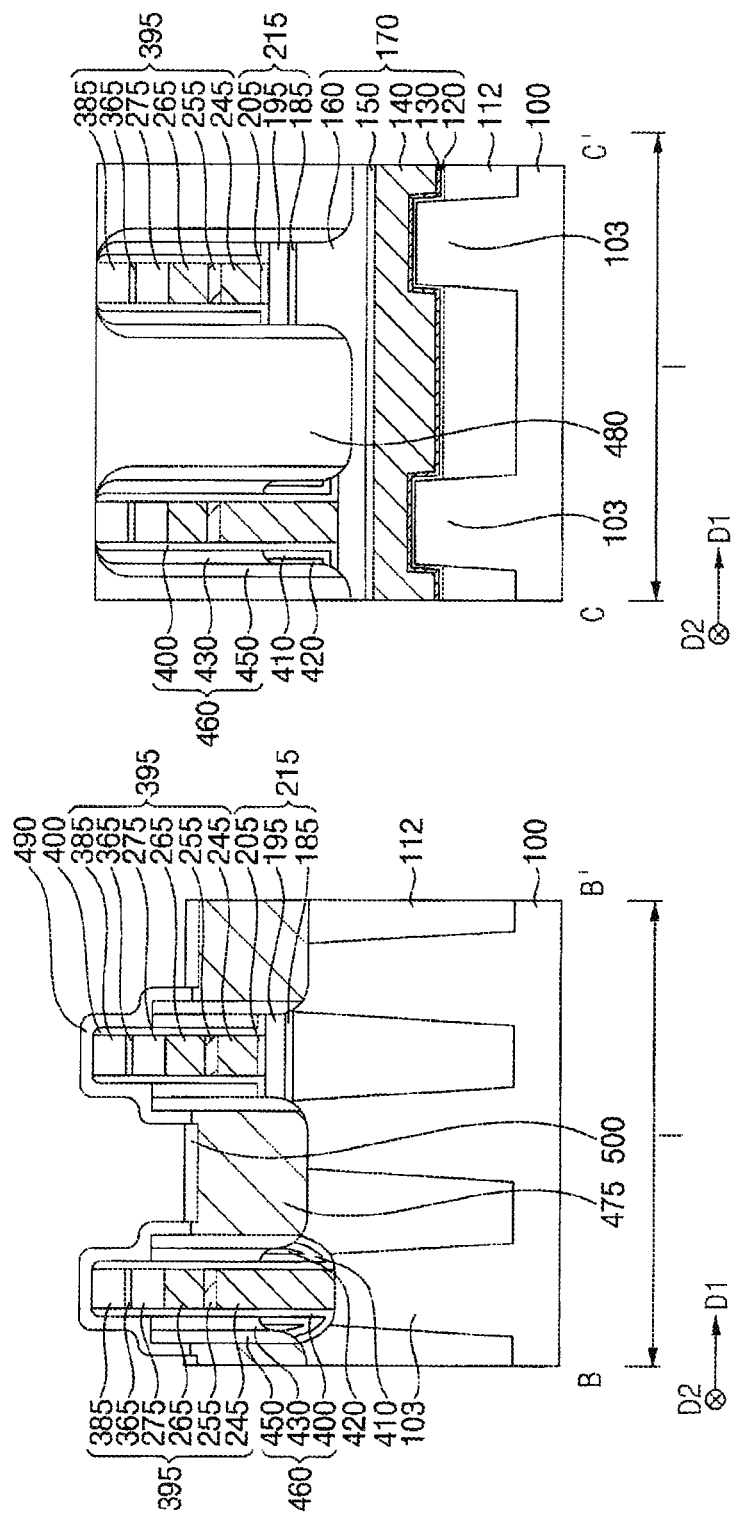

Referring to FIG. 23, an upper portion of the lower contact plug 475 may be removed to expose an upper portion of the preliminary third spacer structure 460 on the sidewall of the bit line structure 395, and upper portions of the sixth and seventh spacers 430 and 450 of the exposed preliminary third spacer structure 460 may be removed.

An upper portion of the lower contact plug 475 may be further removed, and thus the upper surface of the lower contact plug 475 may be lower than uppermost surfaces of the sixth and seventh spacers 430 and 450.

An eighth spacer layer may be formed on the bit line structure 395, the preliminary third spacer structure 460, the second capping pattern 480, the first capping layer 380, and the lower contact plug 475, and may be anisotropically etched (e.g. with a dry etch) so that an eighth spacer 490 may be formed to cover the preliminary third spacer structure 460 on each of opposite sidewalls of the bit line structure 395 in the first direction D1 and that an upper surface of the lower contact plug 475 may be exposed.

A metal salicide pattern/silicide pattern 500 may be formed on the exposed upper surface of the lower contact plug 475. In some example embodiments, the metal silicide pattern 500 may be formed by forming a first metal layer on the first and second capping patterns 385 and 480, the first capping layer 380, the eighth spacer 490 and the lower contact plug 475, thermally treating/annealing the first metal layer, and removing an unreacted portion of the first metal layer. The metal silicide pattern 500 may include, e.g., at least one of cobalt silicide (CoSix), nickel silicide (NiSix), titanium silicide (TiSix), etc.

Figure 24:
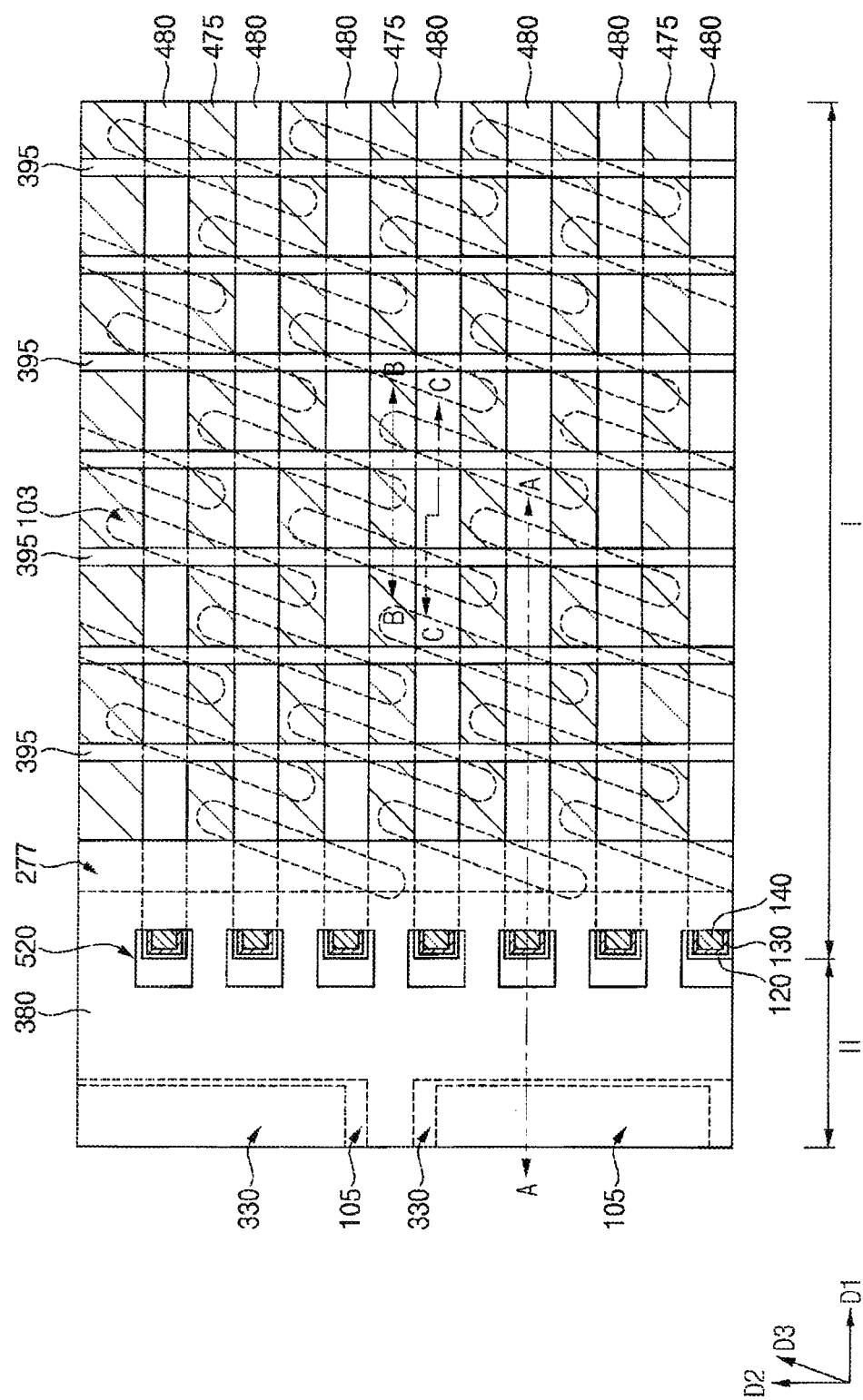
Figure 25:
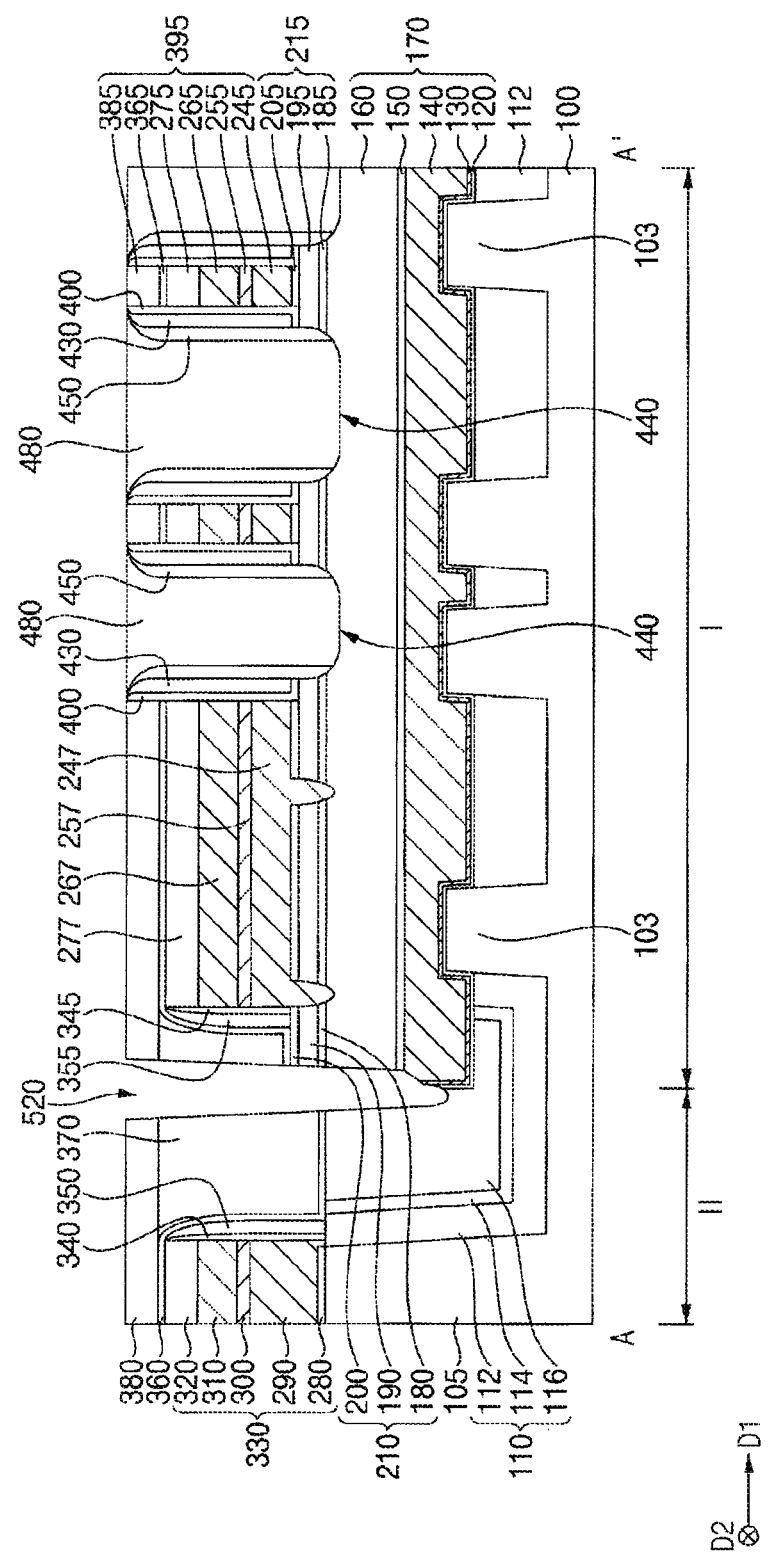

Referring to FIGS. 24 and 25, a first sacrificial layer may be formed on the first and second capping patterns 385 and 480, the first capping layer 380, the eighth spacer 490, the metal silicide pattern 500, and the lower contact plug 475, and may be planarized until the upper surfaces of the first and second capping patterns 385 and 480 and the first capping layer 380 are exposed.

The first sacrificial layer may include, e.g., at least one of silicon-on-hardmask (SOH), amorphous carbon layer (ACL), etc.

A fifth opening 520 may be formed through a portion of the first capping layer 380 at a boundary area between the first and second regions I and II of the substrate 100, and portions of the first insulating interlayer 370, the first etch stop layer 360, the insulation layer structure 210, the first gate mask 160, the second conductive pattern 150 and the isolation pattern structure 110 under the portion of the first capping layer 380 so as to expose the first conductive pattern 140. The fifth opening 520 may also expose the first barrier pattern 130 and the first gate insulation pattern 120 on the sidewall of the first conductive pattern 140.

In some example embodiments, the fifth opening 520 may have a tapered profile, e.g. may have a width gradually decreasing from a top toward a bottom thereof. A sidewall of the fifth opening 520 may have a slope angle, e.g. a tangent angle, of about 70 degrees to about 90 degrees with respect to the upper surface of the substrate 100 and/or with respect to the first direction D1. However, a portion of the sidewall of the fifth opening 520 exposing the first conductive pattern 140 may have a slope angle (or tangent angle) that is less than the slope angle of other portions of the sidewall of the fifth opening 520, which may be in a range of about 30 degrees to about 70 degrees with respect to the upper surface of the substrate 100 and/or with respect to the first direction D1.

In some example embodiments, a portion of the fifth opening 520 exposing the isolation pattern structure 110 may protrude from a portion of the fifth opening 520 exposing the first conductive pattern 140.

Figure 26:
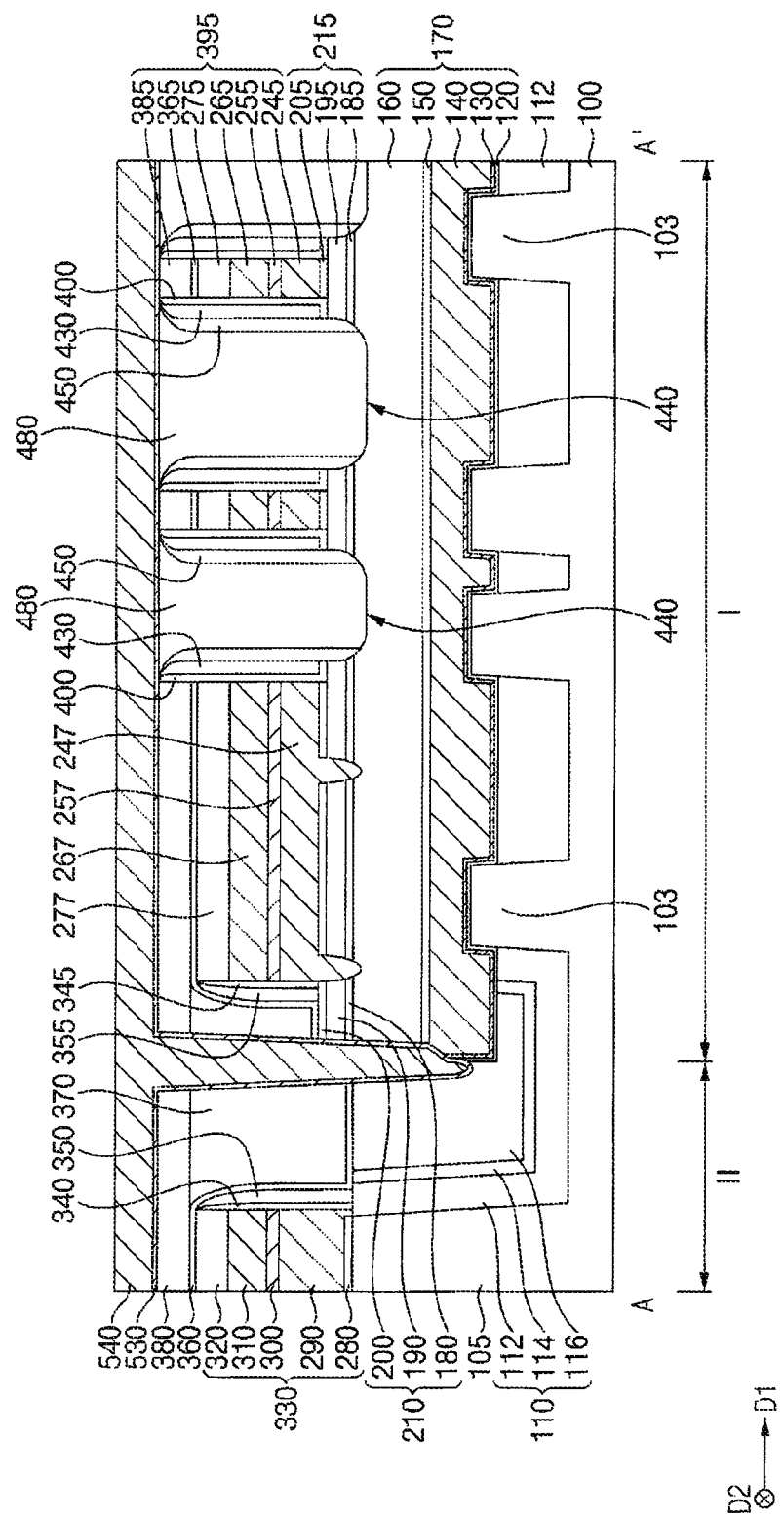
Figure 27:
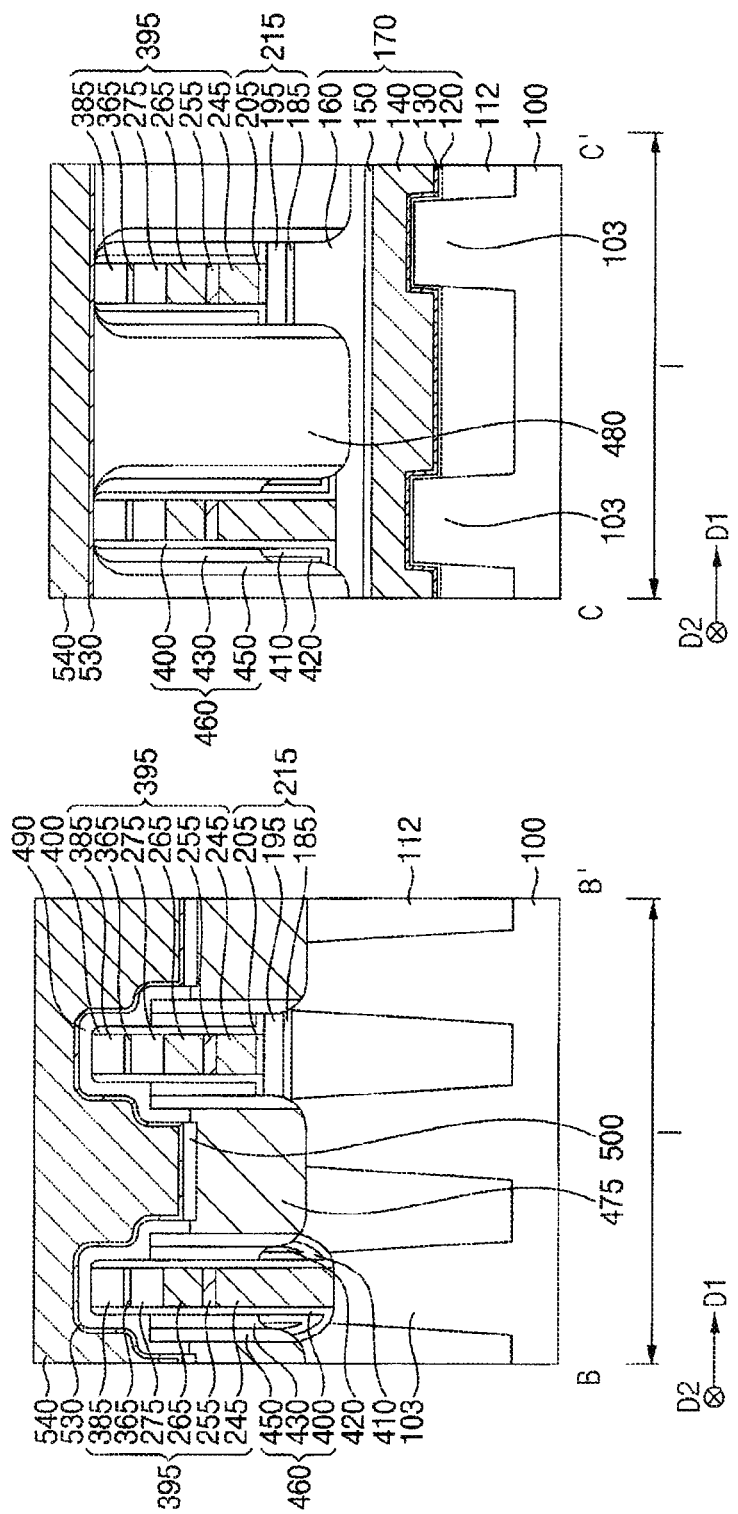

Referring to FIGS. 26 and 27, after removing the first sacrificial layer, a fifth barrier layer 530 may be formed on the first and second capping patterns 385 and 480, the eight spacer 490, the metal silicide pattern 500 and the lower contact plug 475 on the first region I of the substrate 100, and the first capping layer 380, the sidewall of the fifth opening 520, and the first conductive pattern 140, the first barrier pattern 130, the first gate insulation pattern 120 and the isolation pattern structure 110 exposed by the fifth opening 520 on the second region II of the substrate 100, and a second metal layer 540 may be formed on the fifth barrier layer 530 to fill a space between the bit line structures 395 and the fifth opening 520.

A planarization process may be further performed on the second metal layer 540. The planarization process may include a chemical mechanical polishing (CMP) process and/or an etch back process.

Figure 28:
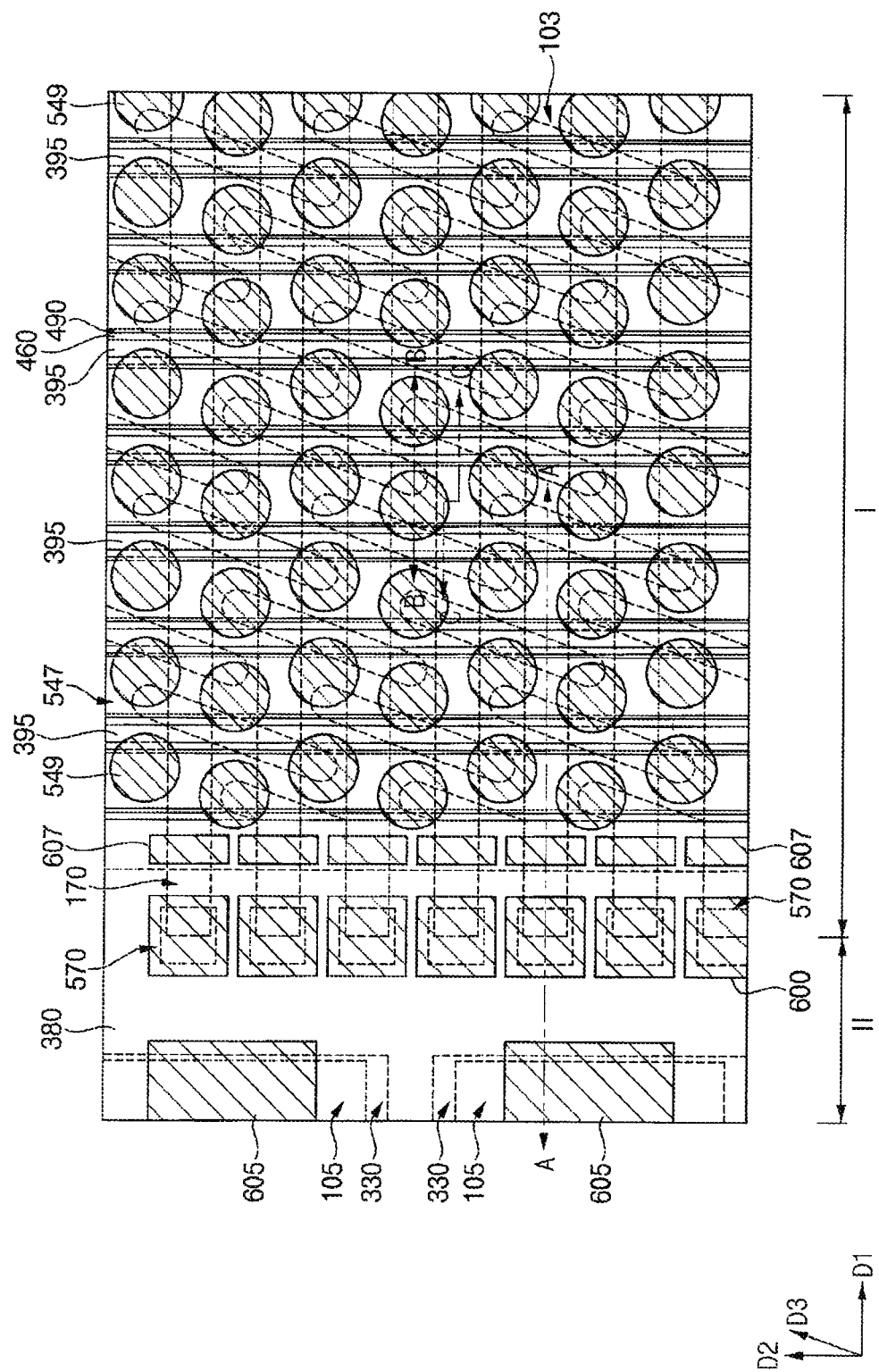
Figure 29:
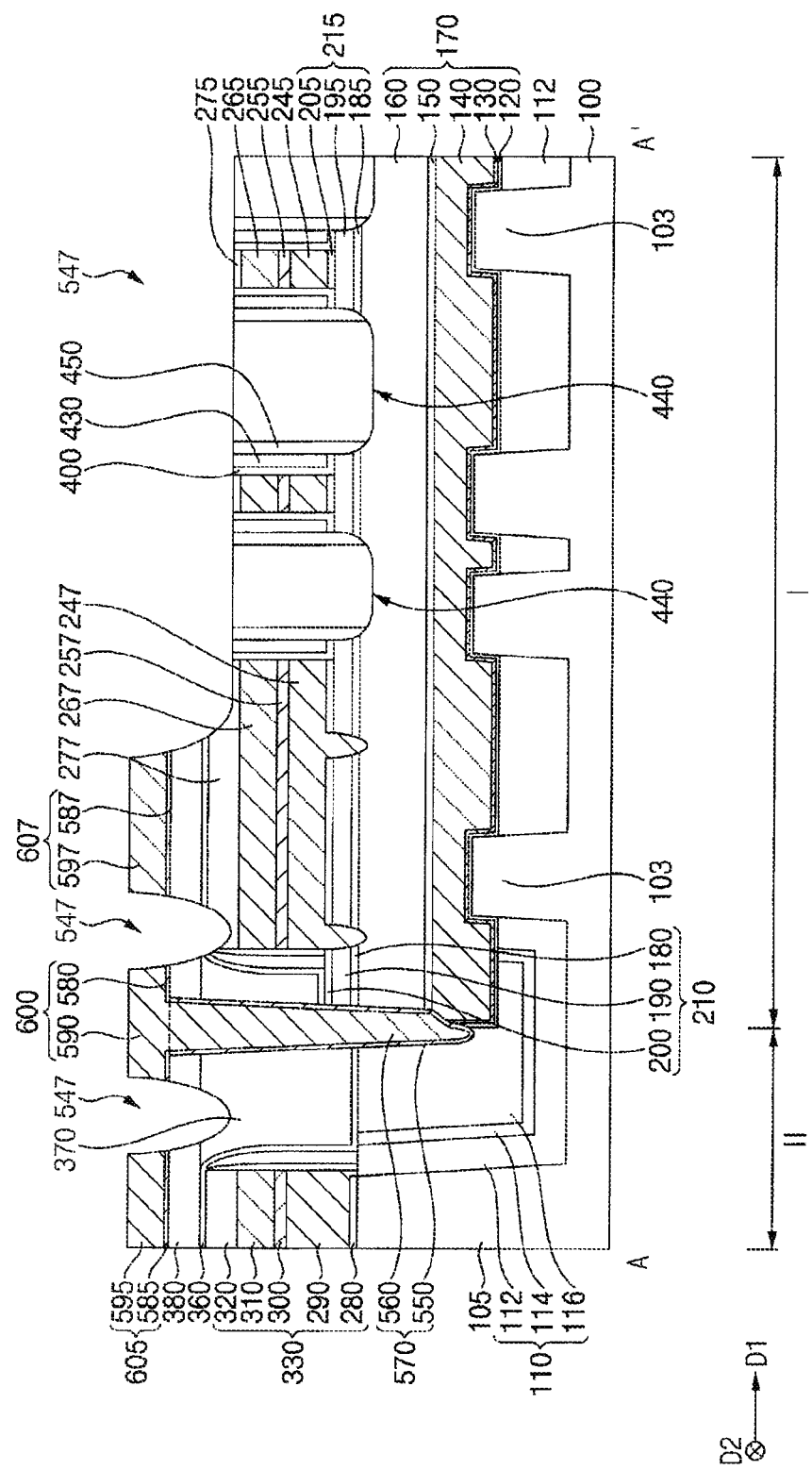
Figure 30:
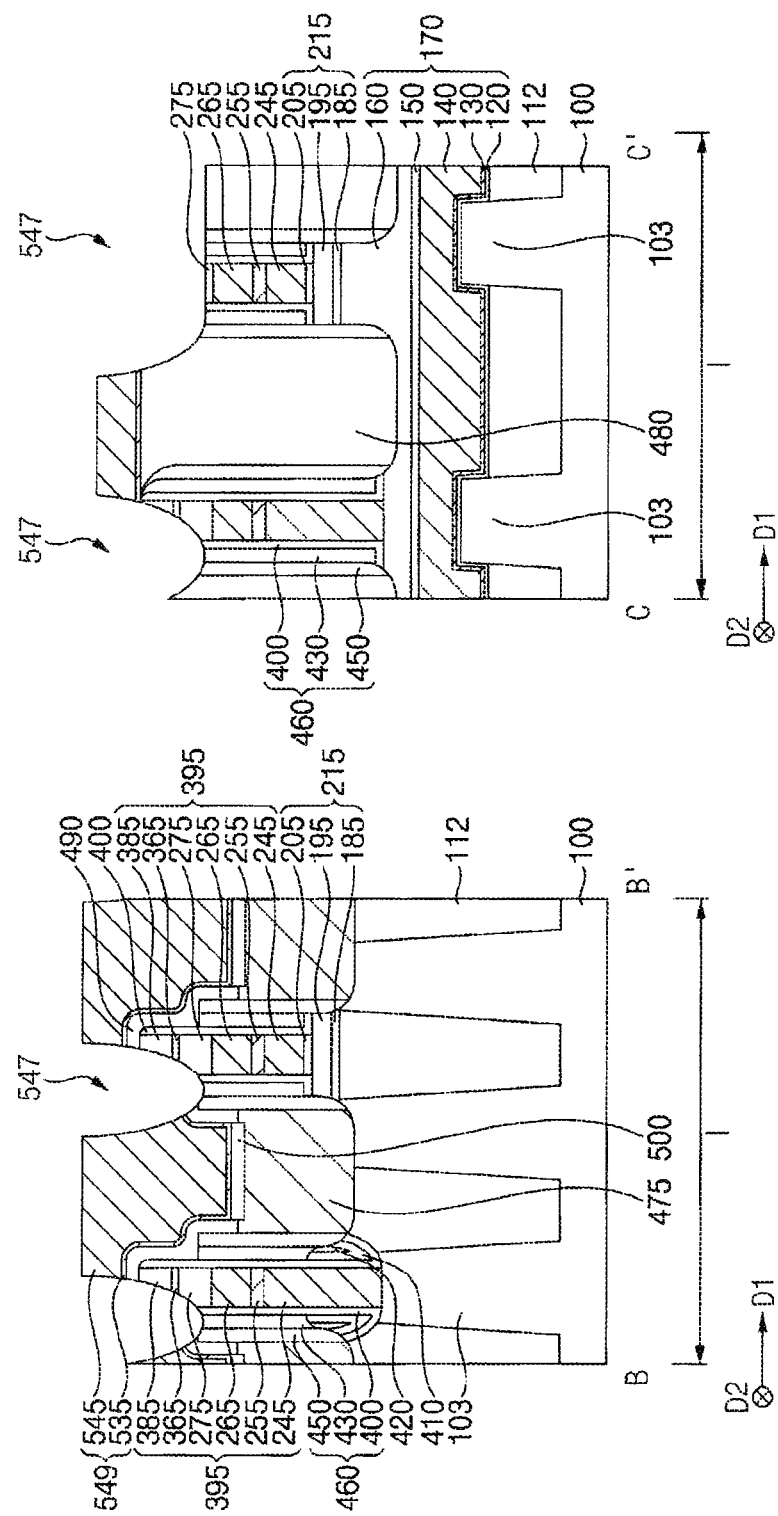

Referring to FIGS. 28 to 30, the second metal layer 540 and the fifth barrier layer 530 may be patterned.

Thus, an upper contact plug 549 may be formed on the first region I of the substrate 100, a second wiring 605 may be formed on the second region II of the substrate 100, and a first wiring 600 may be formed on a boundary area between the first and second regions I and II of the substrate 100. Additionally, a third wiring 607 may be formed on a portion of the first region I of the substrate 100 adjacent to the second region II of the substrate 100 in the first direction D1. A sixth opening 547 may be formed between the upper contact plug 549 and the first to third wirings 600, 605 and 607.

The sixth opening 547 may be formed by partially removing not only the second metal layer 540 and the fifth barrier layer 530, but also the first and second capping patterns 385 and 480, the first capping layer 380, the preliminary third spacer structure 460, the eighth spacer 490, the first etch stop layer 360, the first etch stop pattern 365 and the first mask 275, and thus may expose an upper surface of the sixth spacer 430.

As the sixth opening 547 is formed, the second metal layer 540 and the fifth barrier layer 530 may be transformed into a first metal pattern 545 and a fifth barrier pattern 535, respectively, covering a lower surface of the first metal pattern 545 on the first region I of the substrate 100, which may together form an upper contact plug 549. In some example embodiments, a plurality of upper contact plugs 549 may be spaced apart from each other in each of the first and second directions D1 and D2, and may be arranged in a honeycomb pattern (e.g. in a hexagonal pattern or triangular pattern or regular hexagonal pattern or regular triangular pattern) in a plan view. Each of the upper contact plugs 549 may have a shape of a circle, ellipse, or polygon in a plan view.

The lower contact plug 475, the metal silicide pattern 500 and the upper contact plug 549 sequentially stacked on the first region I of the substrate 100 may form a first contact plug structure.

The first wiring 600 may include a third metal pattern 590 and a seventh barrier pattern 580 covering a lower surface of the third metal pattern 590. A second contact plug 570 including a second metal pattern 560 and a sixth barrier pattern 550 may be formed on the fifth opening 520. The second wiring 605 may include a fourth metal pattern 595 and an eighth barrier pattern 585 covering a lower surface of the fourth metal pattern 595. The third wiring 607 may include a fifth metal pattern 597 and a ninth barrier pattern 587 covering a lower surface of the fifth metal pattern 597.

In some example embodiments, the first wiring 600 may overlap the fifth opening 520 in the vertical direction, and a plurality of first wirings 600 may be spaced apart from each other in the second direction D2. The first wiring 600 may be electrically connected to the first conductive pattern 140 through the second contact plug 570, and thus may apply electrical signals to the first gate structure 170. The second wiring 605 may overlap the second gate structure 330 in the vertical direction, and two second wirings 605 spaced apart from each other in the second direction D2 are shown in the drawings (e.g. in FIG. 28(, however, inventive concepts may not be limited thereto. The third wiring 607 may overlap the dummy bit line structure in the vertical direction, and a plurality of third wirings 607 spaced apart from each other in the second direction D2 is shown in the drawing, however, the inventive concept may not be limited thereto.

Figure 31:
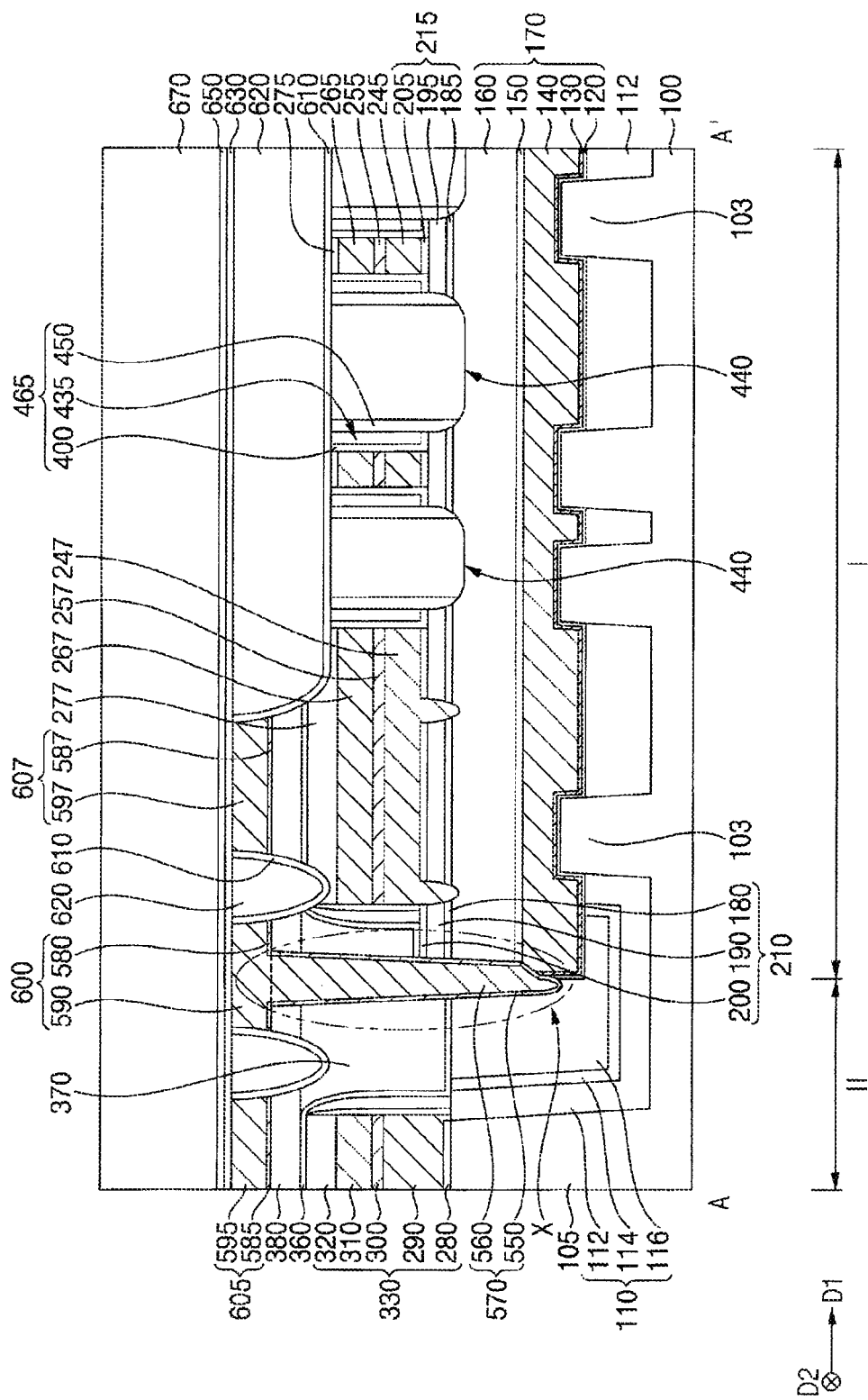
Figure 32:
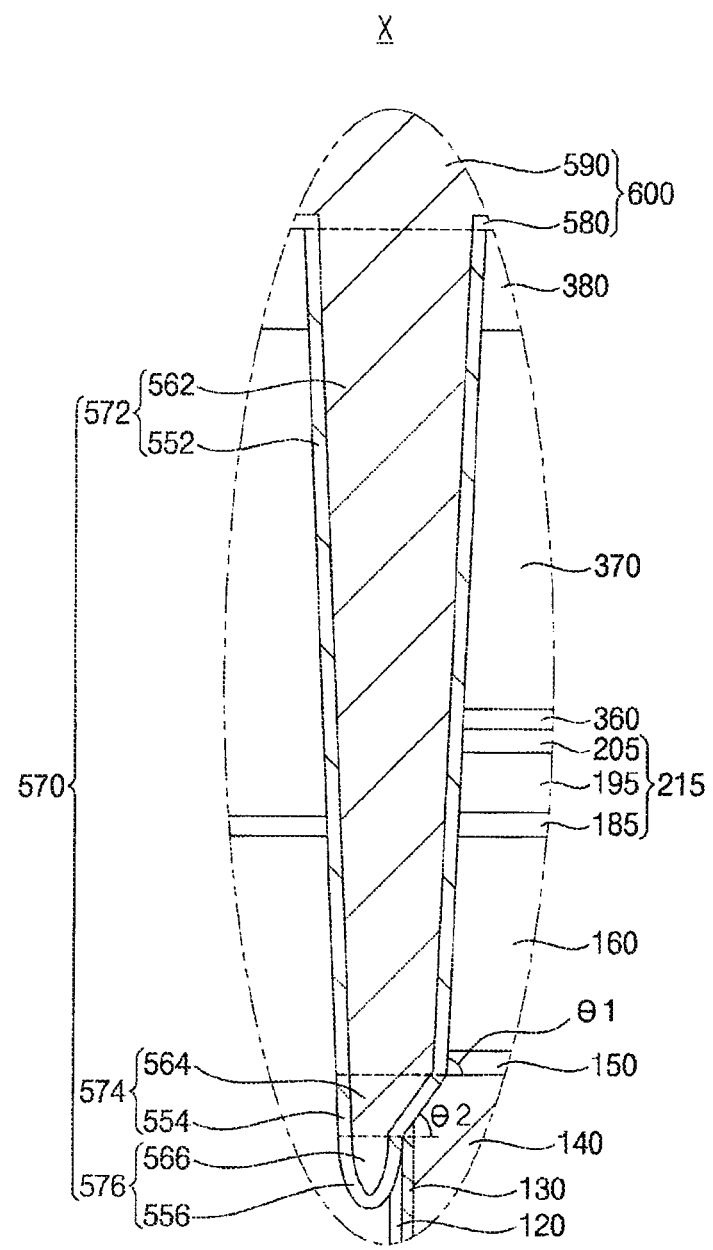
Figure 33:
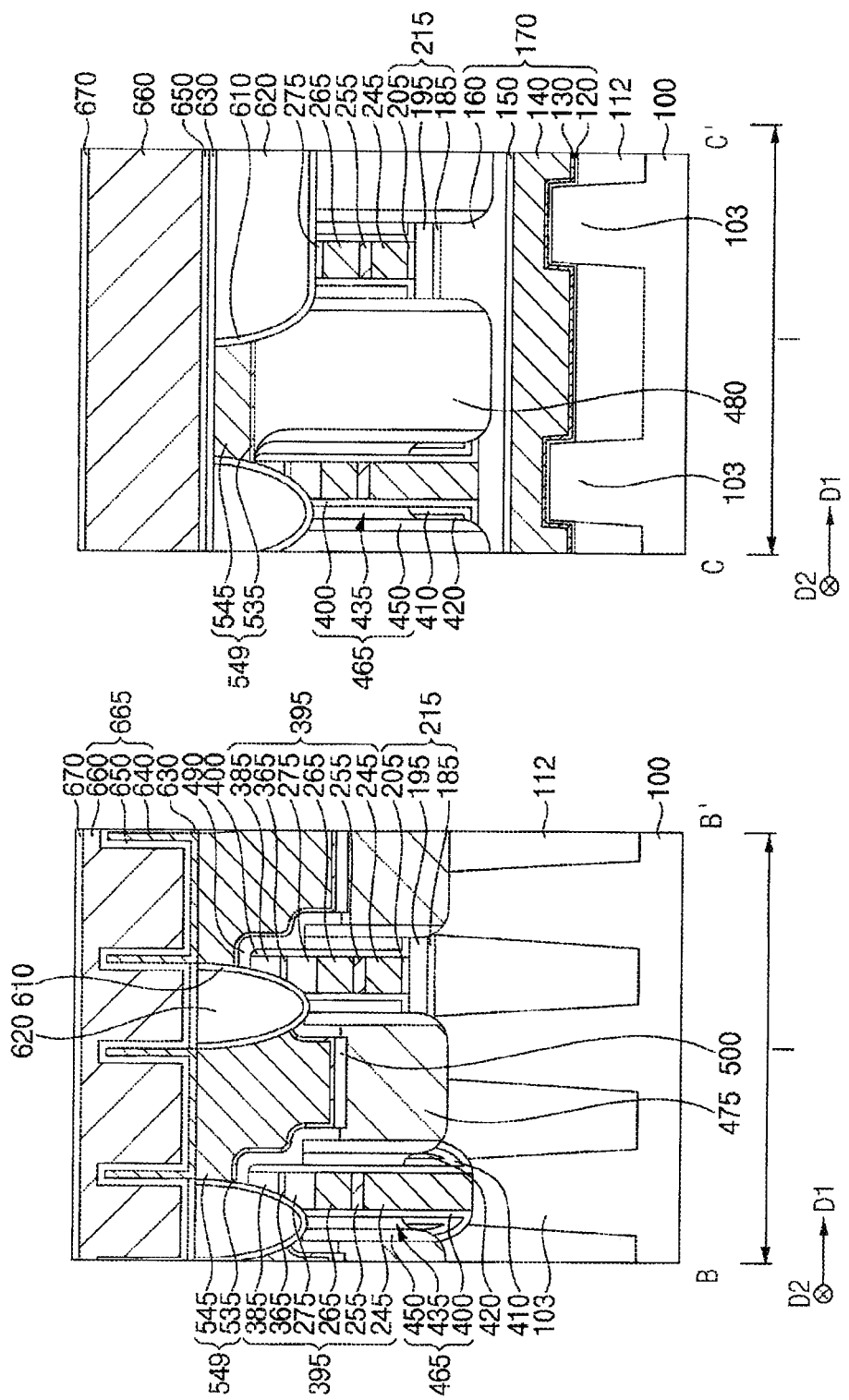

Referring to FIGS. 31 to 33, the exposed sixth spacer 430 may be removed to form an air gap 435 connected to the sixth opening 547. The sixth spacer 430 may be removed by, e.g., a wet etching process.

In some example embodiments, not only a portion of the sixth spacer 430 on the sidewall of the bit line structure 395 extending in the second direction directly exposed by the sixth opening 547 but also other portions of the sixth spacer 430 parallel to the directly exposed portion thereof in the horizontal direction may be removed. For example, not only the portion of the sixth spacer 430 exposed by the sixth opening 547 not to be covered by the upper contact plug 549 but also a portion of the sixth spacer 430 covered by the upper contact plug 549 may be removed.

A second insulating interlayer may be formed to fill the sixth opening 547.

In some example embodiments, the second insulating interlayer may include sixth and seventh insulation layers 610 and 620 sequentially stacked. The sixth insulation layer 610 may include a material having a low gap filling characteristic, and thus the air gap 435 under the sixth opening 547 may not be filled. The air gap 435 may be also referred to as an air spacer 435, and may form a third spacer structure 465 together with the fifth and seventh spacers 400 and 450. For example, the air gap 435 may be a spacer including an air such as clean, dry air. The seventh insulation layer 620 may include an oxide, e.g., silicon oxide and/or a nitride, e.g., silicon nitride.

A storage element such as a memristor and/or a hysteresis element and/or a capacitor 665 may be formed on an upper surface of the upper contact plug 549.

For example, a second etch stop layer 630 and a mold layer (not shown) may be sequentially formed on the upper contact plug 549, the second insulating interlayer, and the first to third wirings 600, 605 and 607, and partially etched to form a seventh opening partially exposing the upper surface of the upper contact plug 549. The second etch stop layer 630 may include a nitride, e.g., silicon nitride.

A lower electrode layer (not shown) may be formed on a sidewall of the seventh opening, the exposed upper surface of the upper contact plug 549 and the mold layer, a second sacrificial layer (not shown) may be formed on the lower electrode layer to fill the seventh opening, and the lower electrode layer and the second sacrificial layer may be planarized until an upper surface of the mold layer is exposed to divide the lower electrode layer. The second sacrificial layer and the mold layer may be removed by, e.g., a wet etching process, and thus a lower electrode 640 having a cylindrical shape may be formed on the exposed upper surface of the upper contact plug 549. Alternatively or additionally, the lower electrode 640 may have a pillar shape filling the seventh opening. The lower electrode 640 may include a metal, a metal nitride, a metal silicide, polysilicon doped with at least one of boron, phosphorus, or arsenic, etc.

A dielectric layer 650 may be formed on a surface of the lower electrode 640 and the second etch stop layer 630, and an upper electrode 660 may be formed on the dielectric layer 650 so that the capacitor 665 including the lower electrode 640, the dielectric layer 650 and the upper electrode 660 may be formed on the first region I of the substrate 100.

The dielectric layer 650 may include, e.g., a metal oxide, and the upper electrode 660 may include at least one of metal, a metal nitride, a metal silicide, doped polysilicon, etc.

A third insulating interlayer 670 may be formed on the capacitor 665 on the first region I of the substrate 100 and the second etch stop layer 630 on the second region II of the substrate 100, and contact plugs and upper wirings may be formed through the third insulating interlayer 670 to be electrically connected to the first to third wirings 600, 605 and 607 so that the fabrication of the semiconductor device may be completed.

The semiconductor device manufactured/fabricated by the above processes may have following structural characteristics.

Referring to FIGS. 28 and 31 to 33, the semiconductor device may include the first and second active patterns 103 and 105 on the cell region I and the peripheral circuit region II, respectively, of the substrate 100; the first gate structure 170 extending in the first direction D1 to be buried at an upper portion of the first active pattern 103 and including the first conductive pattern 140, the first barrier pattern 130 covering the sidewall and the lower surface of the first conductive pattern 140, the second conductive pattern 150 on the first conductive pattern 140 and the first barrier pattern 130, the first gate mask 160 on the second conductive pattern 150, and the first gate insulation pattern 120 covering the sidewalls of the second conductive pattern 150 and the first gate mask 160; the bit line structure 395 contacting a central upper surface of the first active pattern 103 and extending in the second direction D2; the first contact plug structure contacting each of opposite edge upper surfaces of the first active pattern 103; the capacitor 665 on the first contact plug structure; and the second contact plug 570 contacting an end portion in the first direction D1 of the first gate structure 170 and including the first extension portion 572 extending in the vertical direction to contact the sidewalls of the first gate mask 160 and the second conductive pattern 150, the second extension portion 574 under the first extension portion 572 and contacting the first extension portion 572 and the sidewall of the first conductive pattern 140, and the protrusion portion 576 under the second extension portion 574 and contacting the second extension portion 574 of which a lower surface does not contact the first conductive pattern 140.

In some example embodiments, a first slope angle/tangent angle with respect to the upper surface of the substrate 100 of a sidewall of the first extension portion 572 may be greater than a second slope angle/tangent angle with respect to the upper surface of the substrate 100 of the second extension portion 574 contacting the first extension portion 572.

In some example embodiments, a plurality of first active patterns 103 each of which may extend in the third direction D3 may be spaced apart from each other in each of the first and second directions D1 and D2, and thus a plurality of first gate structures 170 may be spaced apart from each other in the second direction D2 and a plurality of bit line structures 395 may be spaced apart from each other in the first direction D1.

In some example embodiments, a plurality of first contact plug structures may be spaced apart from each other in each of the first and second directions D1 and D2, and thus a plurality of capacitors 665 may be spaced apart from each other in each of the first and second directions D1 and D2.

In some example embodiments, the first conductive pattern 140 may include a metal, the second conductive pattern 150 may include doped polysilicon, the first barrier pattern 130 may include a metal nitride, and the first gate insulation pattern 120 may include an oxide.

In some example embodiments, the first slope angle/tangent angle may be in a range of about 70 degrees to about 90 degrees, and the second slope angle/tangent angle may be in a range of about 30 degrees to about 70 degrees.

In some example embodiments, the second slope may be uniform in the vertical direction, e.g. the tangent may be uniform.

In some example embodiments, the first extension portion 572 of the second contact plug 570 may have a width gradually decreasing from a top toward a bottom thereof, the second extension portion 574 of the second contact plug 570 may have a width gradually decreasing from a top toward a bottom thereof, and the protrusion portion 576 of the second contact plug 570 may have a width gradually decreasing from a top toward a bottom thereof. Thus, a maximum width of the protrusion portion 576 may be substantially equal to a minimum width of the second extension portion 574, and a maximum width or first width or locally maximum of the second extension portion 574 may be substantially equal to a second width and/or a minimum width and/or a locally minimum width of the first extension portion 572.

In some example embodiments, a portion of the second contact plug 570 may overlap the first gate structure 170 in the vertical direction, and other portions of the second contact plug 570 might not overlap the first gate structure 170 in the vertical direction.

In some example embodiments, the second extension portion 574 included in the second contact plug 570 may contact the sidewall of the first conductive pattern 140 and the upper surface of the first barrier pattern 130, and the protrusion portion 576 included in the second contact plug 570 may contact the outer sidewall of the first barrier pattern 130 and the upper surface of the first gate insulation pattern 120.

The first extension portion 572 included in the second contact plug 570 may include a sixth metal pattern 562 and a tenth barrier pattern 552 covering a sidewall of the sixth metal pattern 562, the second extension portion 574 may include a seventh metal pattern 564 and an eleventh barrier pattern 554 covering a sidewall of the seventh metal pattern 564, and the protrusion portion 576 may include an eighth metal pattern 566 and a twelfth barrier pattern 556 covering a sidewall and a lower surface of the eighth metal pattern 566.

In the semiconductor device, the second contact plug 570 may contact the slanted upper sidewall of the first conductive pattern 140 included in the first gate structure 170, and thus may contact the first conductive pattern 140 at a relatively large area so as to decrease the contact resistance. Additionally or alternatively, the second contact plug 570 may further include the protrusion portion 576 contacting the outer sidewall of the first barrier pattern 130, and thus may further contact the first gate electrode including the first conductive pattern 140 and the first barrier pattern 130, so as to decrease the contact resistance and/or improve speed and/or power of the semiconductor device.

Before forming the fifth opening 520 in which the second contact plug 570 is formed, an additional etching process for partially removing the second conductive pattern 150 on the first conductive pattern 140 might not be performed. That is, the fifth opening 520 has to be formed through the second conductive pattern 150 including doped polysilicon to expose the upper surface of the first conductive pattern 140, however, if the second conductive pattern 150 has a large thickness, the etching process for forming the fifth opening 520 is difficult, so that an additional etching process for partially removing the second conductive pattern 150 is needed before forming the fifth opening 520.

However, in some example embodiments, the fifth opening 520 may be formed through the sidewall of the second conductive pattern 150 to expose the sidewall of the end portion of the first conductive pattern 140 instead of the upper surface of the first conductive pattern 140. Thus, even if the second conductive pattern 150 has a large thickness, the amount of the second conductive pattern 150 to be removed might not be great. Additionally or alternatively, the isolation pattern structure 110 covering the end portion of the first gate structure 170 is also etched, so that the etching process for forming the fifth opening 520 may be easily performed. Accordingly, an additional etching process for partially removing the second conductive pattern 150 is not needed/used, which may simplify the whole processes.

While inventive concepts have been shown and described with reference to some example embodiments thereof, it will be understood by those of ordinary skill in the art that various changes in form and details may be made thereto without departing from the spirit and scope of example embodiments as set forth by the following claims.

What is claimed is:
1. A method of manufacturing a semiconductor device, the method comprising:
partially etching an upper portion of a substrate to form a recess extending in a first direction parallel to an upper surface of the substrate;

forming a gate structure in the recess, the gate structure including:
a first conductive pattern;
a second conductive pattern on the first conductive pattern; and
a gate mask on the second conductive pattern;
partially etching an end portion of the gate structure in the first direction to form an opening, the opening extending through end portions of the gate mask and the second conductive pattern of the gate structure to expose a portion of the first conductive pattern, and a bottom of the opening being lower than a lower surface of the exposed portion of the first conductive pattern; and
forming a contact plug in the opening.

2. The method according to claim 1, wherein the first conductive pattern includes at least one of a metal or a metal nitride, and the second conductive pattern includes polysilicon.

3. The method according to claim 1, the method further comprising:
partially etching the upper portion of the substrate to form an active pattern in the substrate; and
forming an isolation pattern covering at least a portion of a sidewall of the active pattern,
wherein partially etching the upper portion of the substrate to form the recess includes partially etching upper portions of the active pattern and the isolation pattern.

4. The method according to claim 3, wherein partially etching the end portion of the gate structure in the first direction to form the opening includes partially etching a portion of the isolation pattern adjacent to the gate structure in the first direction.

5. The method according to claim 1, wherein the opening includes:
a first portion extending through the end portions of the gate mask and the second conductive pattern of the gate structure; and
a second portion under the first portion, the second portion exposing the portion of the first conductive pattern, and
wherein a first angle of a sidewall of the first portion with respect to the upper surface of the substrate is greater than a second angle of a sidewall of the second portion with respect to the upper surface of the substrate.

6. The method according to claim 5, wherein the second angle is greater than or equal to about 30 degrees and is less than about 70 degrees.

7. The method according to claim 5, wherein the first angle is greater than or equal to about 70 degrees and equal to or less than about 90 degrees.

8. The method according to claim 5, wherein the opening further includes a protrusion portion under the second portion, the protrusion portion being lower than the lower surface of the exposed portion of the first conductive pattern.

9. The method according to claim 8, wherein a maximum width of the protrusion portion of the opening is equal to a minimum width of the second portion of the opening.

10. The method according to claim 8, wherein the protrusion portion of the opening does not overlap the gate structure in a vertical direction perpendicular to the upper surface of the substrate.

11. The method according to claim 1, wherein the gate structure further includes:
a barrier pattern covering a sidewall and a lower surface of the first conductive pattern; and
a gate insulation pattern covering a sidewall and a lower surface of the barrier pattern, and
wherein the opening exposes portions of the barrier pattern and the gate insulation pattern.

12. A method of manufacturing a semiconductor device, the method comprising:
partially etching an upper portion of a substrate to form a recess extending in a first direction parallel to an upper surface of the substrate;
forming a gate structure in the recess, the gate structure including:
a first conductive pattern;
a second conductive pattern on the first conductive pattern; and
a gate mask on the second conductive pattern;
partially etching an end portion of the gate structure in the first direction to form an opening, the opening including:
a first portion extending through end portions of the gate mask and the second conductive pattern of the gate structure, a sidewall of the first portion having a first angle with respect to the upper surface of the substrate;
a second portion under the first portion, the second portion exposing a portion of the first conductive pattern, a sidewall of the second portion having a second angle with respect to the upper surface of the substrate, and the first angle being greater than the second angle; and
a protrusion portion under the second portion, the protrusion portion being lower than a lower surface of the exposed portion of the first conductive pattern; and
forming a contact plug in the opening.

13. The method according to claim 12, wherein the first conductive pattern includes at least one of a metal or a metal nitride, and the second conductive pattern includes polysilicon.

14. The method according to claim 12, the method further comprising:
partially etching the upper portion of the substrate to form an active pattern in the substrate; and
forming an isolation pattern covering at least a portion of a sidewall of the active pattern,
wherein partially etching the upper portion of the substrate to form the recess includes partially etching upper portions of the active pattern and the isolation pattern.

15. The method according to claim 14, wherein partially etching the end portion of the gate structure in the first direction to form the opening includes partially etching a portion of the isolation pattern adjacent to the gate structure in the first direction.

16. The method according to claim 12, wherein the protrusion portion of the opening does not overlap the gate structure in a vertical direction perpendicular to the upper surface of the substrate.

17. The method according to claim 12, wherein the gate structure further includes:
a barrier pattern covering a sidewall and a lower surface of the first conductive pattern; and
a gate insulation pattern covering a sidewall and a lower surface of the barrier pattern, and
wherein the opening exposes portions of the barrier pattern and the gate insulation pattern.

18. A method of manufacturing a semiconductor device, the method comprising:
- partially etching an upper portion of a substrate to form an active pattern in the substrate;
- forming an isolation pattern covering at least a portion of a sidewall of the active pattern;
- partially etching upper portions of the active pattern and the isolation pattern to form a recess extending in a first direction parallel to an upper surface of the substrate;
- forming a gate structure in the recess, the gate structure including:
  - a first conductive pattern;
  - a second conductive pattern on the first conductive pattern; and
  - a gate mask on the second conductive pattern;
- forming a bit line structure intersecting, in a planar view, a middle portion of the active pattern and extending in a second direction parallel to the upper surface of the substrate and perpendicular to the first direction;
- forming a first contact plug structure contacting each of opposing side end portions of the active pattern;
- partially etching an end portion of the gate structure in the first direction to form an opening, the opening extending through end portions of the gate mask and the second conductive pattern of the gate structure to expose a portion of the first conductive pattern, and a bottom of the opening being lower than a lower surface of the exposed portion of the first conductive pattern;
- forming a second contact plug in the opening to contact the exposed portion of the first conductive pattern of the gate structure; and
- forming a capacitor on the first contact plug structure.

19. The method according to claim 18, wherein the active pattern extends in a third direction parallel to the upper surface of the substrate, the third direction having an acute angle with respect to the first and second directions, and the active pattern being one of a plurality of active patterns apart from each other in the first and second directions,
- the gate structure is one of a plurality of gate structures apart from each other in the second direction, and
- the bit line structure is one of a plurality of bit line structures apart from each other in the first direction.

20. The method according to claim 19, wherein the first contact plug structure is one of a plurality of first contact plug structures apart from each other in the first and second directions, and the capacitor is one of a plurality of capacitors apart from each other in the first and second directions.

* * * * *